(12) United States Patent
Oike

(10) Patent No.: US 10,978,468 B2
(45) Date of Patent: Apr. 13, 2021

(54) SEMICONDUCTOR MEMORY

(71) Applicant: Toshiba Memory Corporation, Tokyo (JP)

(72) Inventor: Go Oike, Mie Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 100 days.

(21) Appl. No.: 16/287,301

(22) Filed: Feb. 27, 2019

(65) Prior Publication Data
US 2019/0371812 A1    Dec. 5, 2019

(30) Foreign Application Priority Data
May 31, 2018   (JP) .............................. JP2018-105325

(51) Int. Cl.
| | |
|---|---|
| *H01L 27/11582* | (2017.01) |
| *H01L 27/11565* | (2017.01) |
| *H01L 29/423* | (2006.01) |
| *H01L 27/11573* | (2017.01) |
| *H01L 27/1157* | (2017.01) |

(52) U.S. Cl.
CPC .... *H01L 27/11582* (2013.01); *H01L 27/1157* (2013.01); *H01L 27/11565* (2013.01); *H01L 27/11573* (2013.01); *H01L 29/4234* (2013.01)

(58) Field of Classification Search
CPC ......... H01L 27/11582; H01L 27/11565; H01L 29/4234; H01L 27/11573; H01L 27/1157; H01L 27/11575; G11C 16/0483
See application file for complete search history.

(56) References Cited

U.S. PATENT DOCUMENTS

| | | |
|---|---|---|
| 7,936,004 B2 | 5/2011 | Kito et al. |
| 9,502,299 B2 | 11/2016 | Hishida et al. |
| 2015/0325303 A1 | 11/2015 | Hashimoto et al. |
| 2016/0343434 A1* | 11/2016 | Lee .......................... H01L 27/24 |
| 2018/0294225 A1* | 10/2018 | Lee ................... H01L 27/11565 |
| 2019/0287995 A1 | 9/2019 | Oike et al. |

FOREIGN PATENT DOCUMENTS

JP    2007-266143 A    10/2007

* cited by examiner

*Primary Examiner* — Julia Slutsker
(74) *Attorney, Agent, or Firm* — Kim & Stewart LLP

(57) ABSTRACT

A semiconductor memory includes first to fourth regions that are arranged in a first direction, and first to third stacked bodies. An active region and a dummy region are provided in the first to third regions. The first stacked body includes an alternating stack of first insulators and first conductors in the active region. The second stacked body includes an alternating stack of second insulators and second conductors in the dummy region. The third stacked body includes an alternating stack of third insulators and third conductors. One of the third conductors closest to a substrate is electrically insulated from one of the first conductors closest to the substrate and electrically connected to one of the second conductors closest to the substrate.

20 Claims, 26 Drawing Sheets

SEMICONDUCTOR MEMORY

CROSS-REFERENCE TO RELATED APPLICATION

This application is based upon and claims the benefit of priority from Japanese Patent Application No. 2018-105325, filed on May 31, 2018, the entire contents of which are incorporated herein by reference.

FIELD

Embodiments described herein relate generally to a semiconductor memory.

BACKGROUND

There is a NAND flash memory which can store data in a nonvolatile manner.

DETAILED DESCRIPTION

Figure 1:
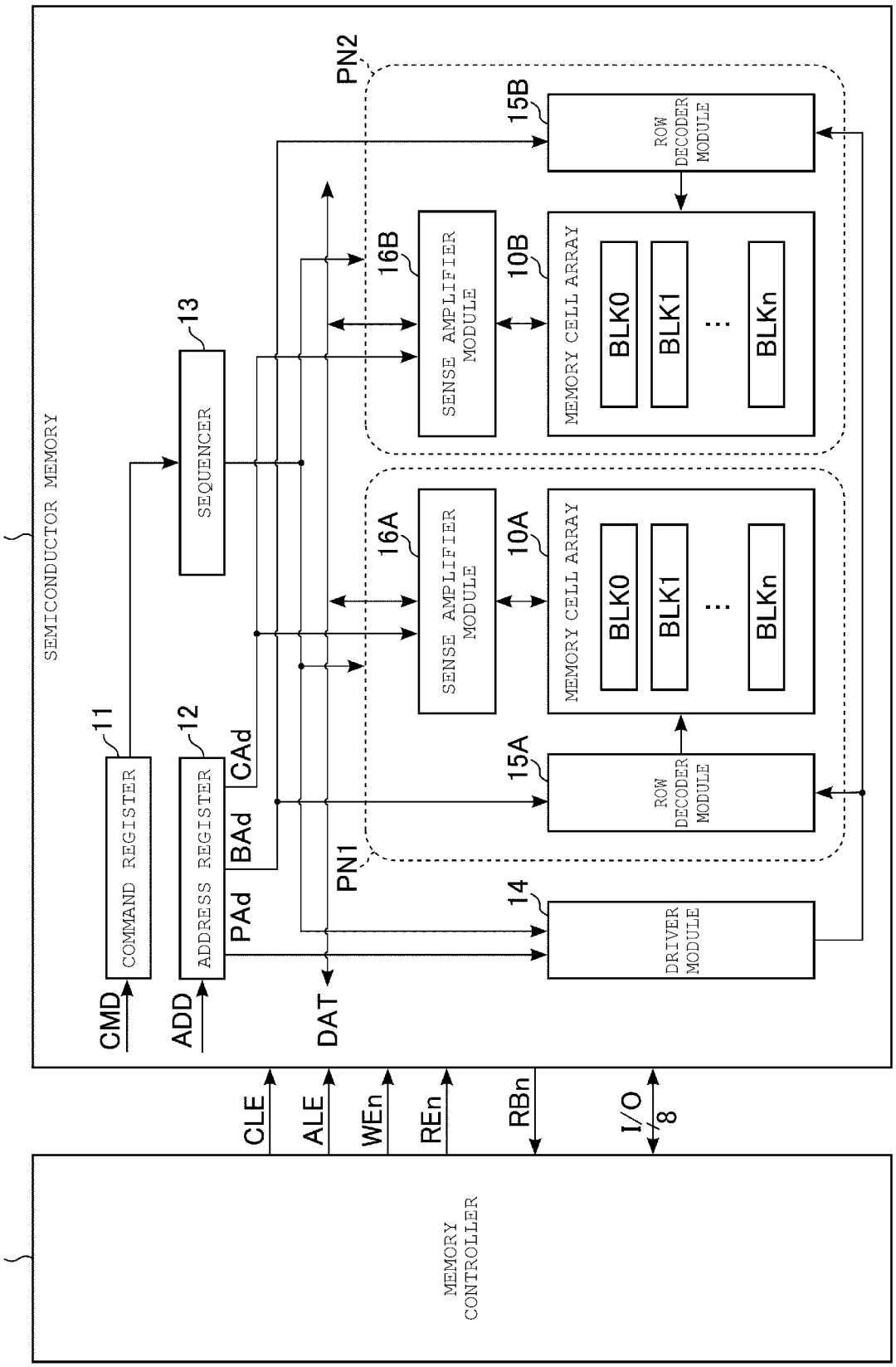
FIG. 1 is a block diagram illustrating a semiconductor memory according to a first embodiment.

Embodiments provide a semiconductor memory capable of detecting a short circuit failure in a word line.

In general, according to an embodiment, a semiconductor memory includes a substrate, and first to third stacked bodies. First to fourth regions are provided in this order along a direction parallel to a surface of the substrate. The first stacked body includes an alternating stack of first insulators and first conductors above the substrate in an active region at part of each of the first to third regions. The second stacked body includes an alternating stack of second insulators and second conductors above the substrate in a dummy region at part of each of the first to third regions. The third stacked body includes an alternating stack of third insulators and third conductors above the substrate in the fourth region. A fourth insulator separating the first stacked body and the third stacked body is provided. A columnar first contact is provided on one of the first conductors closest to the substrate in the first region. A columnar second contact is provided on one of the second conductors closest to the substrate in the first region. A plurality of first pillars is provided, and each of the first pillars extends through the first stacked body in the second region, and having memory cell regions at intersections with the first conductors. A plurality of second pillars is provided, and each of the second pillars extends through the second stacked body in the second region. One of the third conductors closest to the substrate is electrically insulated from said one of the first conductors closest to the substrate, and electrically connected to said one of the second conductors closest to the substrate.

In the following, embodiments will be described with reference to the drawings. Each embodiment exemplifies a device or a method for embodying the technical concept of the present disclosure. The drawings are schematic or conceptual, and a dimension and a proportion in each drawing cannot be said to be the same as actual ones. The technical concept of the present disclosure is not specified by a shape, a structure, a disposition, and the like of an element.

In the following description, elements having the substantially same function and configuration are given the same reference numeral. Numbers after a letter forming a reference sign are referred to by a reference sign including the same letter, and are used to differentiate elements having the same configuration. Similarly, letters after a number forming a reference sign are referred to by a reference sign including the same number, and are used to differentiate elements having the same configuration. In a case where elements indicated by reference signs including the same letter or number are not required to be differentiated from each other, such elements are referred to by a reference sign including only the letter or the number.

1. First Embodiment

In the following, a semiconductor memory 1 according to a first embodiment will be described.

1-1. Configuration of Semiconductor Memory 1

1-1-1. Overall Configuration of Semiconductor Memory 1

The semiconductor memory 1 is, for example, a NAND flash memory which can store data in a nonvolatile manner. The semiconductor memory 1 is controlled by, for example, an external memory controller 2. FIG. 1 illustrates a configuration example of the semiconductor memory 1 according to the first embodiment.

As illustrated in FIG. 1, the semiconductor memory 1 includes, for example, memory cell arrays 10A and 10B, a command register 11, an address register 12, a sequencer 13, a driver module 14, row decoder modules 15A and 15B, and sense amplifier modules 16A and 16B.

In the following, a set of the memory cell array 10A, the row decoder module 15A, and the sense amplifier module 16A will be referred to as a plane PN1. A set of the memory cell array 10B, the row decoder module 15B, and the sense amplifier module 16B will be referred to as a plane PN2.

Both the memory cell arrays 10A and 10B store data in a nonvolatile manner. A plurality of bit lines and a plurality of word lines are provided in both the memory cell arrays 10A and 10B. Each of the memory cell arrays 10A and 10B include a plurality of blocks BLK0 to BLKn (where n is an integer of 1 or greater). The block BLK is an aggregate of nonvolatile memory cells, and is used as, for example, a data erase unit. Each memory cell is associated with a single bit line and a single word line. A detailed configuration of the memory cell array 10 will be described later.

The command register 11 stores a command CMD which is received from the memory controller 2 by the semiconductor memory 1. The command CMD includes, for example, commands for causing the sequencer 13 to perform a read operation, a write operation, an erase operation, and the like.

The address register 12 stores address information ADD which is received from the memory controller 2 by the semiconductor memory 1. The address information ADD includes, for example, a block address BAd, a page address PAd, and a column address CAd. For example, the block address BAd, the page address PAd, and the column address CAd are respectively used to select the block BLK, word line, and bit line.

The sequencer 13 controls the overall operation of the semiconductor memory 1. The sequencer 13 may separately control the plane PN1 and the plane PN2. For example, the sequencer 13 controls the driver module 14 and the plane PN1 based on the command CMD stored in the command register 11, so as to perform a read operation, a write operation, an erase operation, and the like on the plane PN1. Similarly, the sequencer 13 may perform a read operation, a write operation, an erase operation, and the like on the plane PN2.

The driver module 14 generates voltages used for a read operation, a write operation, an erase operation, and the like. The driver module 14 applies a generated voltage to, for example, a signal line corresponding to a selected word line based on the page address PAd stored in the address register 12.

The row decoder modules 15A and 15B respectively correspond to the memory cell arrays 10A and 10B. The row decoder module 15 selects one block BLK in the corresponding memory cell array 10 based on the block address BAd stored in the address register 12. The row decoder module 15 transmits the voltage applied to the signal line corresponding to the selected word line, to the selected word line in the selected block BLK.

The sense amplifier modules 16A and 16B respectively correspond to the memory cell arrays 10A and 10B. In a write operation, the sense amplifier module 16 applies desired voltages to bit lines provided in the corresponding memory cell array 10 according to write data DAT received from the memory controller 2. In a read operation, the sense amplifier module 16 determines data stored in a memory cell based on the voltages of bit lines, reads the determination result, and transmits the determination results to the memory controller 2 as the data DAT.

Communication between the semiconductor memory 1 and the memory controller 2 complies with, for example, the NAND interface standard. For example, a command latch enable signal CLE, an address latch enable signal ALE, a write enable signal WEn, a read enable signal REn, a ready/busy signal RBn, and an input/output signal I/O are used in communication between the semiconductor memory 1 and the memory controller 2.

The command latch enable signal CLE is a signal indicating that the input/output signal I/O received by the semiconductor memory 1 is the command CMD. The address latch enable signal ALE is a signal indicating that the input/output signal I/O received by the semiconductor memory 1 is the address information ADD. The write enable signal WEn is a signal for instructing the semiconductor memory 1 to input the input/output signal I/O. The read enable signal REn is a signal for instructing the semiconductor memory 1 to output the input/output signal I/O.

The ready/busy signal RBn is a signal for notifying the memory controller 2 of whether the semiconductor memory 1 is in a ready state where the semiconductor memory 1 is able to receive a command from the memory controller 2 or in a busy state where the semiconductor memory 1 is unable to receive a command. The input/output signal I/O is, for example, a signal with an 8-bit width, and may include the command CMD, the address information ADD, the data DAT, and the like.

A single semiconductor device may be formed by a combination of the semiconductor memory 1 and the memory controller 2. Such a semiconductor device may include, for example, a memory card such as an SD™ card, or a solid state drive (SSD).

The first embodiment describes semiconductor memory 1 having two planes (planes PN1 and PN2), but the semiconductor memory 1 may include three or more planes. The configuration of a plane is not limited to the above-described configurations, and it is sufficient that a plane includes at least the memory cell array 10.

1-1-2. Circuit Configuration of Semiconductor Memory 1

Figure 2:
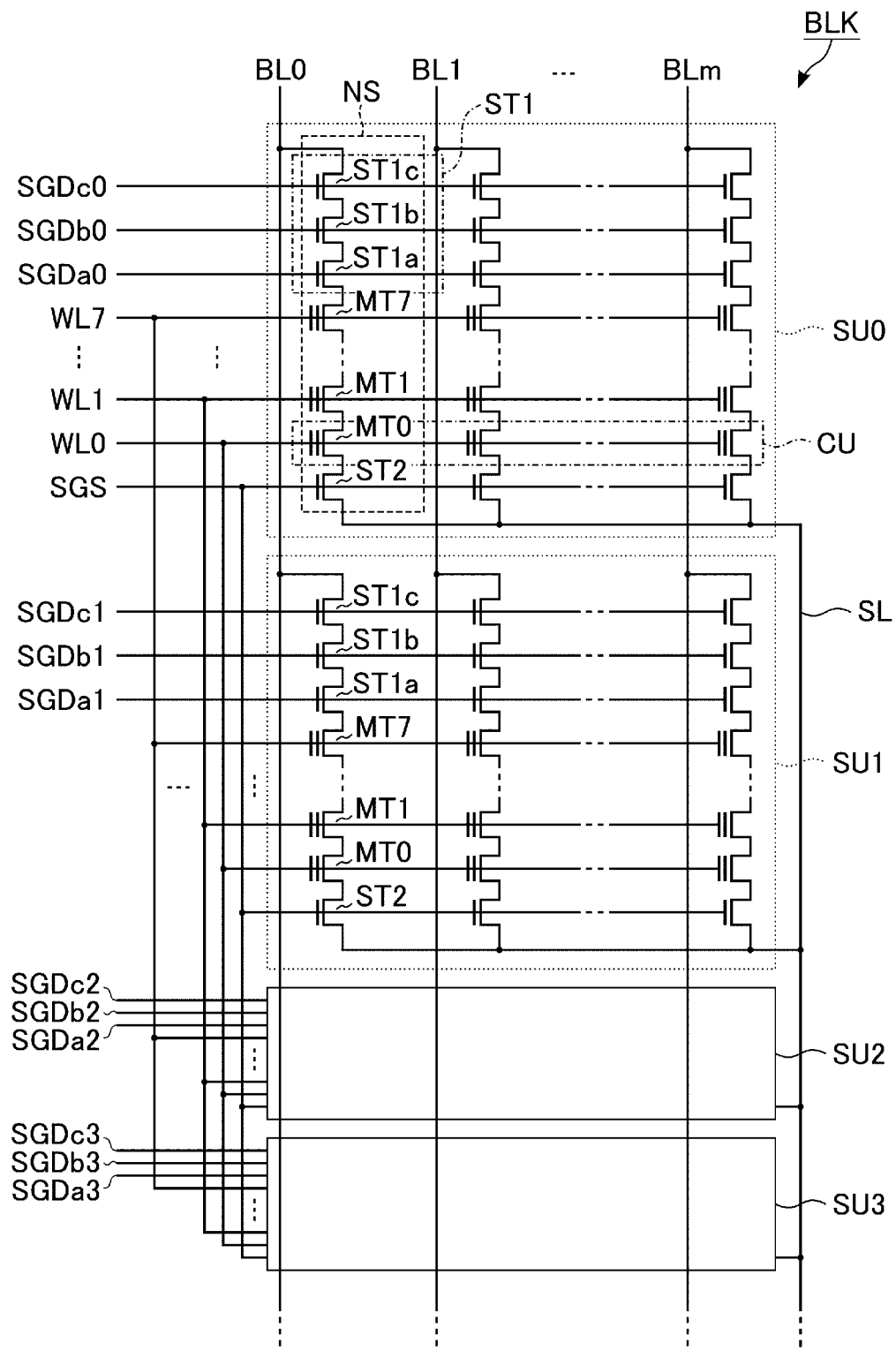
FIG. 2 is a circuit diagram illustrating an example of a circuit configuration of a memory cell array of the semiconductor memory according to the first embodiment.

FIG. 2 illustrates an example of a circuit configuration of the memory cell array 10 of the semiconductor memory 1 according to the first embodiment by extracting one block BLK from a plurality of blocks BLK in the memory cell array 10.

As illustrated in FIG. 2, the block BLK includes, for example, four string units SU0 to SU3. Each string unit SU includes a plurality of NAND strings NS respectively associated with bit lines BL0 to BLm (where m is an integer of 1 or greater).

The NAND string NS includes, for example, memory cell transistors MT0 to MT7, and select transistors ST1 and ST2. The select transistor ST1 is, for example, a set of select transistors ST1a, S1b, and ST1c which are connected in series to each other. The number of transistors in the select transistor ST1 may be designed to be any number.

The memory cell transistor MT includes a control gate and a charge storage layer, and stores data in a nonvolatile manner. Both the select transistors ST1 and ST2 are used to select the string unit SU during various operations.

In each NAND string NS, the memory cell transistors MT0 to MT7 are connected in series to each other between a source of the select transistor ST1a and a drain of the select transistor ST2. The control gates of the memory cell transistors MT0 to MT7 in the same block BLK are respectively connected jointly to the word lines WL0 to WL7.

In each NAND string NS, a drain of the select transistor ST1c is connected to the corresponding bit line BL. In other words, one end of the select transistor ST1 is connected to one end of the memory cell transistors MT0 to MT7 connected in series to each other, and the other end of the select transistor ST1 is connected to the corresponding bit line BL.

Gates of the select transistors ST1a, S1b, and ST1c in the string unit SU0 are connected jointly to select gate lines SGDa0, SGDb0, and SGDc0. Gates of the select transistors ST1a, ST1b, and ST1c in the string unit SU1 are respectively connected jointly to select gate lines SGDa1, SGDb1, and SGDc1.

Gates of the select transistors ST1a, ST1b, and ST1c in the string unit SU2 are respectively connected jointly to select gate lines SGDa2, SGDb2, and SGDc2. Gates of the select transistors ST1a, ST1b, and ST1c in the string unit SU3 are respectively connected jointly to select gate lines SGDa3, SGDb3, and SGDc3.

Sources of the select transistor ST2 in the same block BLK are connected jointly to a source line SL. Gates of the select transistors ST2 in the same block BLK are connected jointly to a select gate line SGS.

In the circuit configuration of the memory cell array 10 described above, drains of the select transistors ST1c corresponding to the same column among a plurality of blocks BLK are connected to the same bit line BL. The source line SL is connected jointly to, for example, the plurality of blocks BLK.

A plurality of memory cell transistors MT connected to a common word line WL in a single string unit SU will be referred to as, for example, a cell unit CU. The storage capacity of each cell unit CU changes based on the number of bits of data stored in the memory cell transistor MT.

For example, a single cell unit CU stores 1-page data when each memory cell transistor MT stores 1-bit data, and stores 2-page data when each memory cell transistor MT stores 2-bit data.

"1-page data" above is defined as the total amount of data stored in the cell unit CU configured with memory cell transistors MT each storing 1-bit data.

A circuit configuration of the memory cell array 10 of the semiconductor memory 1 according to the first embodiment is not limited to the above-described configuration. For example, the number of memory cell transistors MT and the select transistors ST1 and ST2 in each NAND string NS may be designed to be any number. The number of string units SU in each block BLK may be designed to be any number.

1-1-3. Structure of Semiconductor Memory 1

In the following, a description will be made of an example of a structure of the semiconductor memory 1 according to the first embodiment. The semiconductor memory 1 according to the first embodiment has a structure in which circuits such as the sense amplifier module 16 are provided between a semiconductor substrate and the memory cell array 10, that is, under the memory cell array 10.

In the drawings referred to below, the X direction corresponds to the extension direction of the word lines WL, the Y direction corresponds to the extension direction of the bit lines BL, and a Z direction corresponds to the direction perpendicular to a surface of the semiconductor substrate 20 on which the semiconductor memory 1 is formed.

In sectional views referred to below, for better understanding of the drawings, elements such as an insulating layer (interlayer insulating film), a wiring, and a contact are not illustrated as appropriate. In plan views, for better understanding of the views, hatching is added as appropriate. Hatching added to the plan views is not necessarily associated with a material or a characteristic of a hatched element.

Planar Layout of Memory Cell Arrays 10A and 10B

Figure 3:
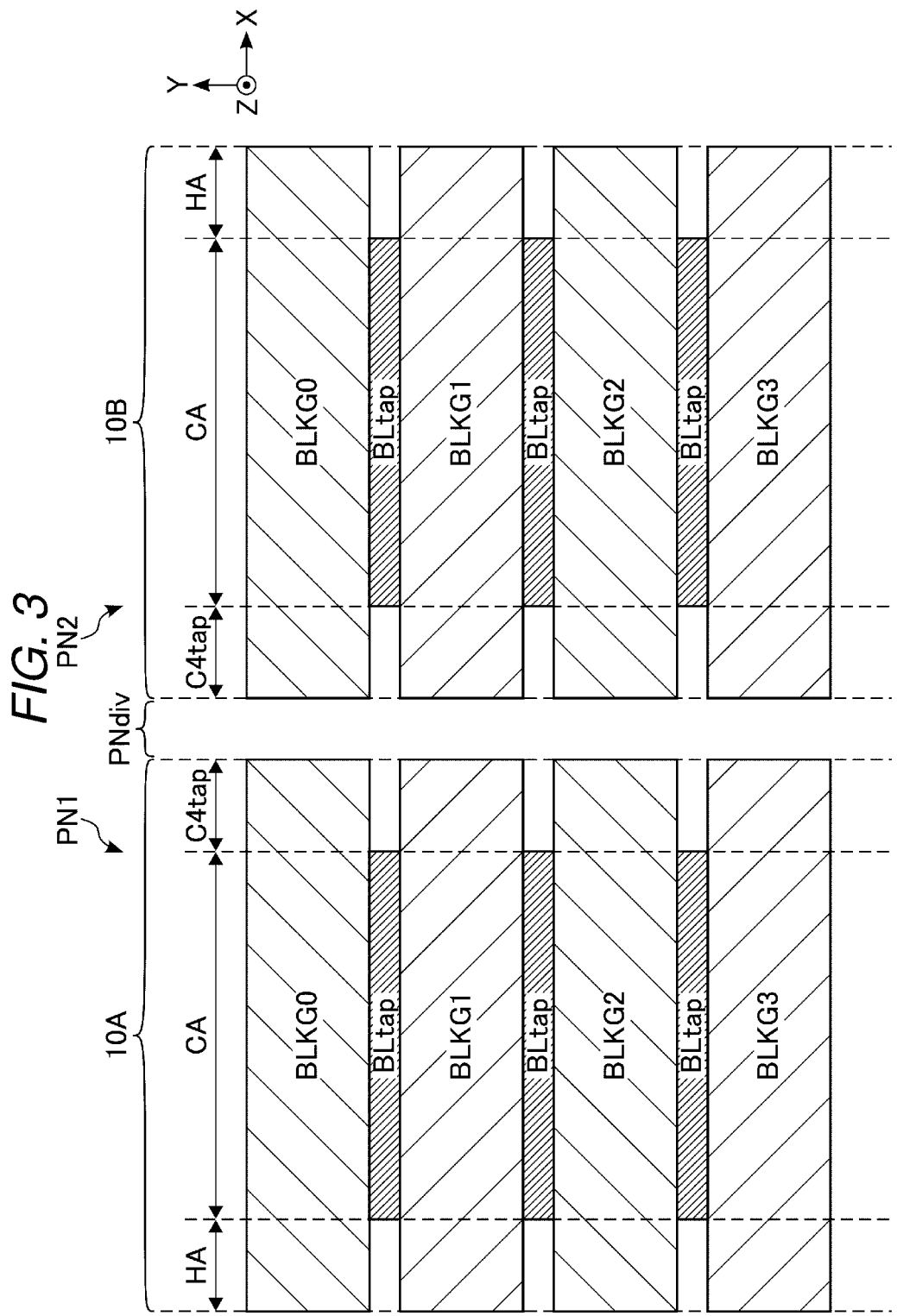
FIG. 3 illustrates a plan view of an example of the memory cell array of the semiconductor memory according to the first embodiment.

FIG. 3 illustrates an example of a planar layout of the memory cell arrays 10A and 10B of the semiconductor memory 1 according to the first embodiment.

As illustrated in FIG. 3, a region of the memory cell array 10A corresponding to the plane PN1 and a region of the memory cell array 10B corresponding to the plane PN2 are adjacent to each other in the X direction. A plane separation region PNdiv is provided between the region of the memory cell array 10A and the region of the memory cell array 10B.

Each of the regions corresponding to the memory cell arrays 10A and 10B may be divided into, for example, a cell region CA, a lead region HA, and a C4 connection region C4tap along the X direction.

The cell region CA is a region in which a plurality of NAND strings NS are formed. The lead region HA is a region in which contacts for electrically connecting select gate lines SGD and SGS and the word lines WL, all of which are connected to the NAND strings NS, to the row decoder module 15 are formed. The C4 connection region C4tap is a region in which contacts for electrically connecting, for example, the source lines SL connected to the NAND strings NS or a power line or a signal line provided on the memory cell array 10 to circuits provided under the memory cell array 10 are formed.

Both the C4 connection region C4tap of the memory cell array 10A and the C4 connection region C4tap of the memory cell array 10B are in contact with the plane separation region PNdiv. Both the lead region HA of the memory cell array 10A and the lead region HA of the memory cell array 10B are separated from the plane separation region PNdiv. In both the memory cell arrays 10A and 10B, the cell region CA is disposed between the lead region HA and the C4 connection region C4tap.

Each of the memory cell arrays 10A and 10B includes, for example, block groups BLKG0 to BLKG3. Each block group BLKG extends in the X direction, and the block groups BLKG0 to BLKG3 are arranged in the Y direction. The number of block groups BLKG in each memory cell array 10 may be designed to be any number. The block group BLKG includes a plurality of blocks BLK. For example, a BL connection region BLtap is provided between block groups BLKG adjacent to each other in a cell region CA.

The BL connection region BLtap is a region in which a contact for electrically connecting the bit line BL connected to the NAND string NS to the sense amplifier module 16 disposed under the memory cell array 10 is formed.

Figure 4:
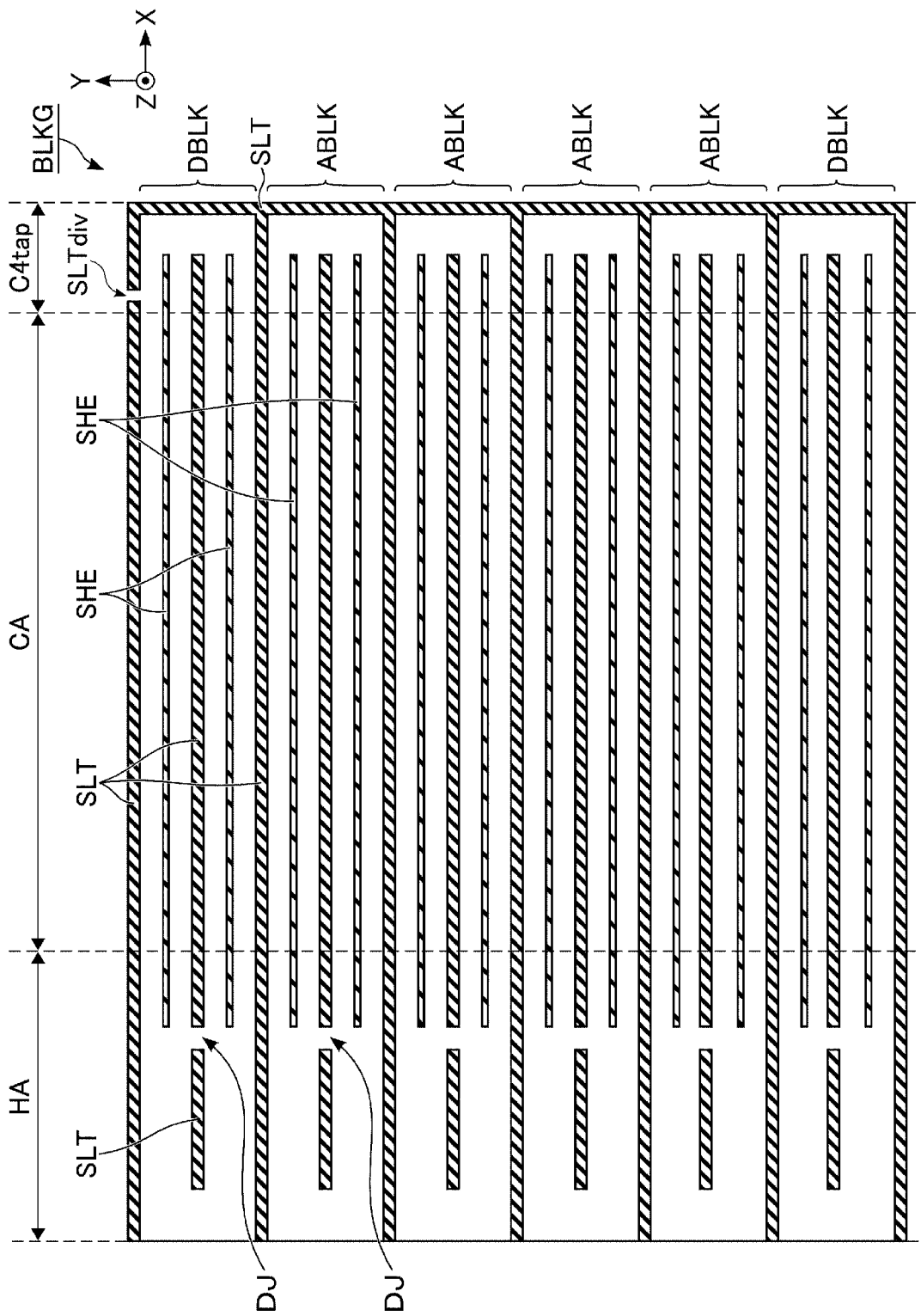
FIG. 4 illustrates another plan view of an example of the memory cell array of the semiconductor memory according to the first embodiment.

FIG. 4 illustrates an example of a more detailed planar layout of the memory cell array 10 of the semiconductor memory 1 according to the first embodiment by extracting a single block group BLKG provided in the memory cell array 10A.

As illustrated in FIG. 4, the block group BLKG includes, for example, four active blocks ABLK and two dummy blocks DBLK.

The active block ABLK is the block BLK used to store data. The total number of active blocks ABLK in each memory cell array 10 corresponds to the total number of blocks BLK in each memory cell array 10.

A dummy block DBLK is a block BLK not used to store data. The dummy block DBLK is provided in order to ensure a shape of a slit SLT or a memory pillar MP which will be described later.

Each of the active block ABLK and the dummy block DBLK extends in the X direction. The four active blocks ABLK are arranged in the Y direction, and are disposed between the two dummy blocks DBLK.

Both the active block ABLK and the dummy block DBLK are provided in, for example, a region two sides of which re in contact with a slit SLT (in the following, referred to as a horizontal-direction slit SLT) extending in the X direction and one side of which is in contact with a slit SLT (in the following, referred to as a vertical-direction slit SLT) extending in the Y direction.

Specifically, the vertical-direction slit SLT is provided at one end part of the block group BLKG in the X direction. A plurality of horizontal-direction slits SLT arranged in the Y direction are in contact with the vertical-direction slit SLT provided at the one end part.

In other words, the slit SLT is provided in a comb shape the other end part in the X direction of which is open. The dummy block DBLK or the active block ABLK is provided in a region between horizontal-direction slits SLT adjacent to each other among a plurality of slits SLT in the comb-shaped slit SLT and in the Y direction.

The vertical-direction slit SLT may be provided at the other end part of the block group BLKG in the X direction. In this case, a plurality of horizontal-direction slits SLT arranged in the Y direction may either be in contact with or separated from the vertical-direction slit SLT at the other end part.

In an active block ABLK, for example, the horizontal-direction slit SLT which extends from the lead region HA to the C4 connection region C4tap in the X direction is provided in the region between horizontal-direction slits SLT adjacent to each other. The horizontal-direction slit SLT has a slit gap DJ in the lead region HA. For example, a slit SHE extending in the X direction is disposed between the horizontal-direction slits SLT arranged in the Y direction. In the active block ABLK, the slit SHE extends, for example, from the vicinity of the slit gap DJ of the lead region HA to the C4 connection region C4tap.

In a dummy block DBLK, the region between the horizontal-direction slits SLT adjacent to each other includes the horizontal-direction slit SLT extending from the lead region HA to the C4 connection region C4tap in the X direction, for example, in the same manner as in the active block ABLK. A slit SHE extending in the X direction is disposed between the horizontal-direction slits arranged in the Y direction, for example, in the same manner as in the active block ABLK.

In the semiconductor memory 1 according to the first embodiment, at least one of the dummy blocks DBLK in the block group BLKG is in contact with at least one slit gap SLTdiv. Specifically, the slit gap SLTdiv is provided, for example, in the horizontal-direction slit SLT between the dummy block DBLK and a peripheral region of the block group BLKG in the C4 connection region C4tap.

In the present specification, the peripheral region of the block group BLKG corresponds to a region adjacent to the dummy block DBLK via the horizontal-direction slit SLT provided at edges of the block group BLKG. In the slit gap SLTdiv, a conductor in the dummy block DBLK is electrically connected to a conductor in the peripheral region of the block group BLKG.

There may be any number of active blocks ABLK and dummy blocks DBLK in each block group BLKG. A dummy block DBLK may be disposed between active blocks ABLK arranged in the Y direction.

The number of horizontal-direction slits SLT in the respective regions of the active block ABLK and that in the dummy block DBLK may differ.

Structure of Memory Cell Array 10 in Cell Region CA

Figure 5:
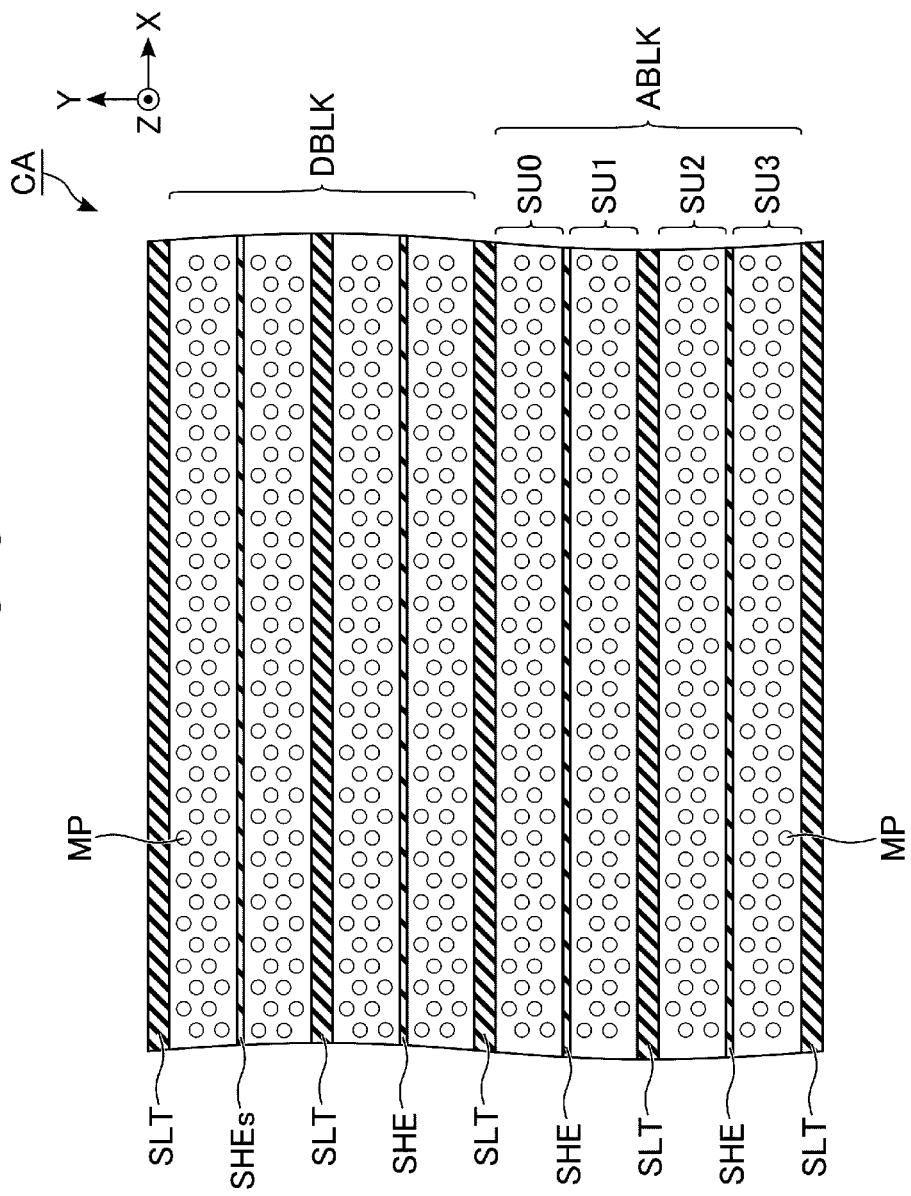
FIG. 5 illustrates a plan view of an example of a cell region of the memory cell array of the semiconductor memory according to the first embodiment.

FIG. 5 illustrates an example of a planar layout of the cell region CA of the memory cell array 10 of the semiconductor memory 1 according to the first embodiment by extracting one active block ABLK and one dummy block DBLK.

As illustrated in FIG. 5, in the cell region CA, the memory cell array 10 includes a plurality of memory pillars MP and a plurality of dummy memory pillars DMP. Specifically, in the active block ABLK, a plurality of memory pillars MP are disposed in a zigzag formation between the slits SLT and SHE. For example, the dummy memory pillars DMP are disposed to overlap the slit SHE.

The memory pillar MP functions as, for example, a single NAND string NS. The dummy memory pillar DMP is a structural body which has the same structure as, for example, that of the memory pillar MP but is not used to store data.

For example, in the active block ABLK, an aggregate of a plurality of memory pillars MP provided between the slits SLT and SHE adjacent to each other corresponds to a single string unit SU. In other words, in the active block ABLK, the string unit SU extends in the X direction. For example, the string units SU0 to SU3 are arranged in the Y direction.

The rest of the planar layout of the dummy block DBLK in the cell region CA is the same as, for example, the planar layout of the active block ABLK, and thus a description thereof will be omitted.

Figure 6:
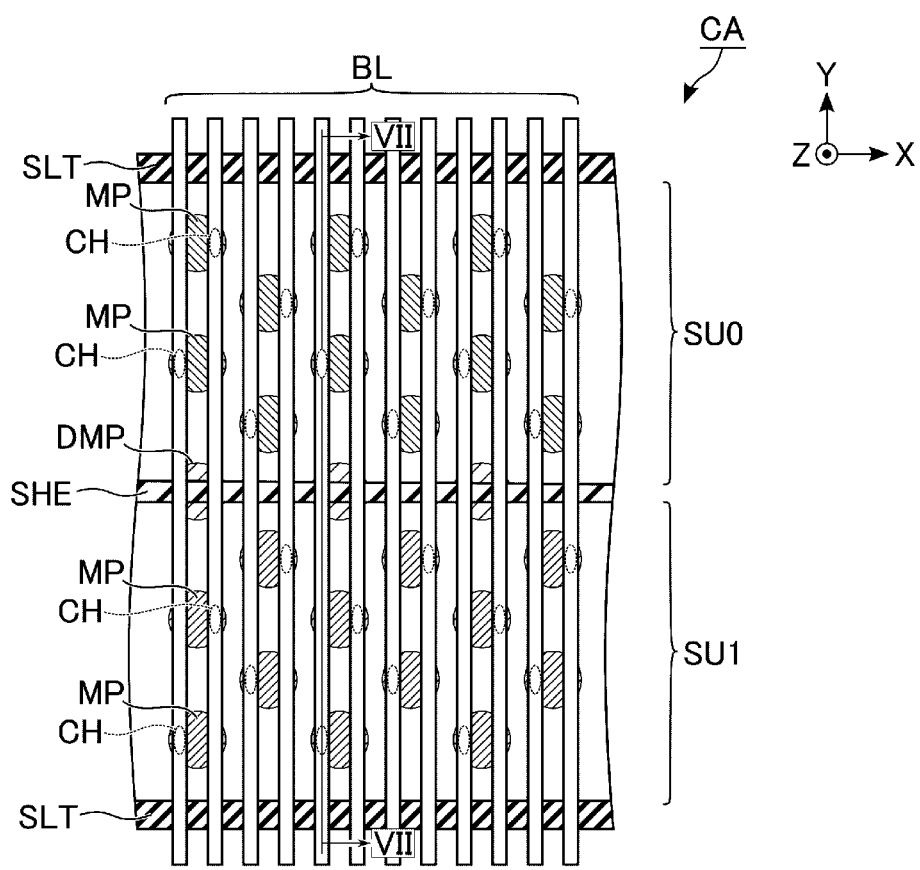
FIG. 6 illustrates another plan view of an example of the cell region of the memory cell array of the semiconductor memory according to the first embodiment.

FIG. 6 illustrates an example of a more detailed planar layout of the cell region CA of the memory cell array 10 of the semiconductor memory 1 according to the first embodiment by extracting the string units SU0 and SU1 of the active block ABLK.

As illustrated in FIG. 6, a plurality of bit lines BL and a plurality of contacts CH are disposed in the memory cell array 10 in correspondence to the memory pillars MP described with reference to FIG. 5.

Specifically, each of the plurality of bit lines BL extends in the Y direction, and the plurality of bit lines BL are arranged in the X direction. The plurality of contacts CH are provided between each bit line BL and memory pillars MP corresponding to the bit line BL.

For example, each memory pillar MP overlaps two bit lines BL. Each memory pillar MP is electrically connected to a single bit line BL among the plurality of overlapping bit lines BL, via the columnar contact CH.

The number of bit lines BL overlapping the memory pillar MP may be designed to be any number. Each memory pillar MP may be electrically connected to one of the overlapping bit lines BL, via the columnar contact CH.

Figure 7:
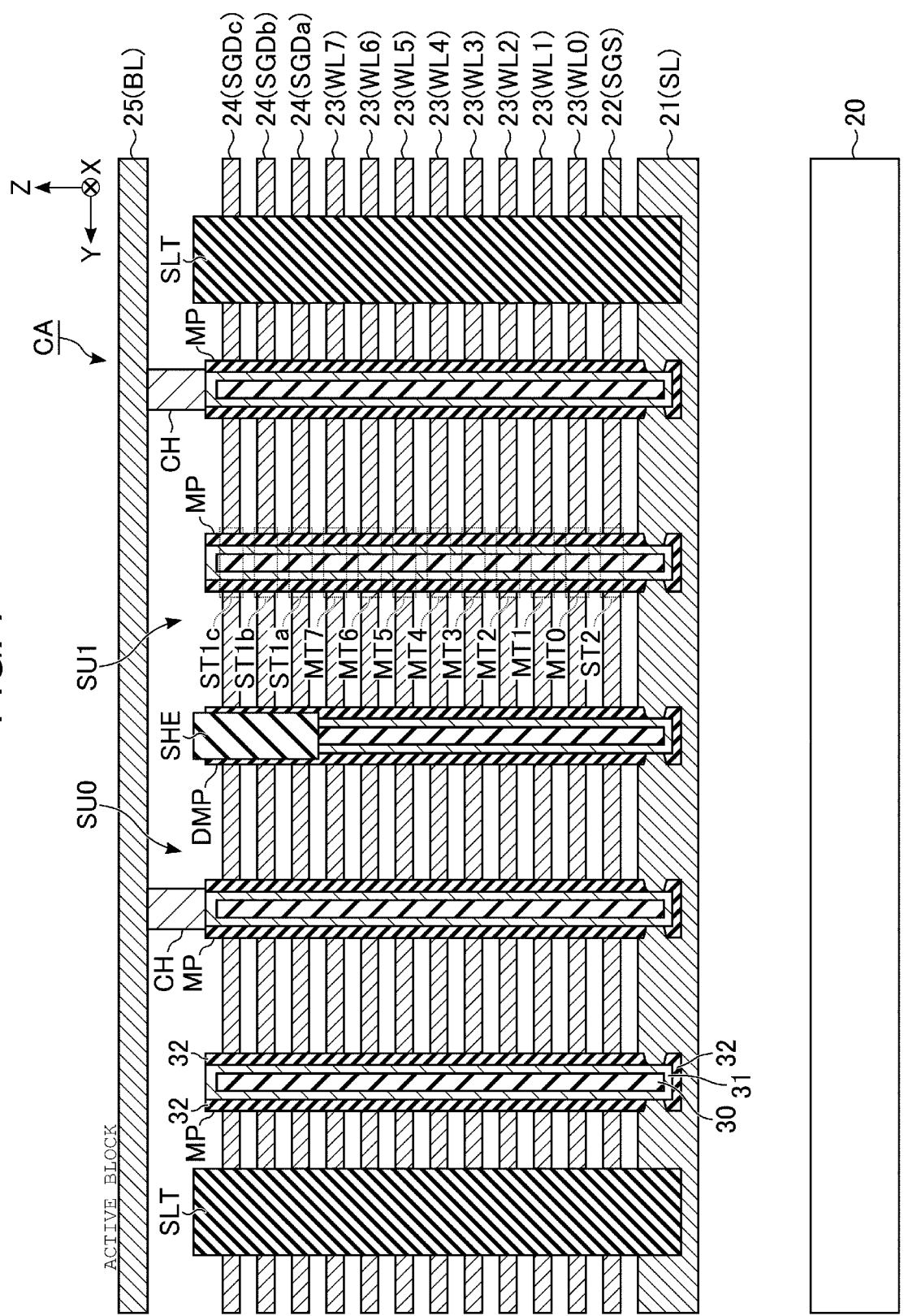
FIG. 7 illustrates a cross-sectional view of an example of the cell region of the memory cell array of the semiconductor memory according to the first embodiment.

FIG. 7 illustrates a cross-sectional view of the memory cell array 10 taken along the line VII-VII in FIG. 6, and illustrates an example of a cross-sectional structure of the memory cell array 10 in a region corresponding to the active block ABLK in the cell region CA.

As illustrated in FIG. 7, the region corresponding to the active block ABLK in the cell region CA includes, for example, conductors 21 to 25, the memory pillars MP, the dummy memory pillars DMP, the contacts CH, and the slits SLT and SHE.

The conductor 21 is provided on the semiconductor substrate 20 via an insulating layer. The conductor 21 is formed, for example, in a plate shape which spreads along an XY plane, and is used as the source line SL. The conductor 21 is, for example, poly-silicon (Si) doped with phosphor. For example, circuits (not illustrated) such as the row decoder module 15 or the sense amplifier module 16 are provided in a region between the semiconductor substrate 20 and the conductor 21, that is, under the memory cell array 10.

The conductor 22 is provided on the conductor 21 via an insulating layer. The conductor 22 is formed, for example, in a plate shape which spreads along the XY plane, and is used as the select gate line SGS. The conductor 22 is, for example, poly-silicon (Si) doped with phosphor.

An insulating layer and the conductor 23 are alternately stacked on the conductor 22. The conductor 23 is formed, for example, in a plate shape which spreads along the XY plane. The plurality of stacked conductors 23 are respectively used as the word lines WL0 to WL7 in this order from the semiconductor substrate 20 side. The conductor 23 contains, for example, tungsten (W). In the following, the region in which the conductors 23 are provided will also be referred to as a W region.

Insulating layers and the conductors 24 are alternately stacked on the conductors 23. A conductor 24 is formed, for example, in a plate shape which spreads along the XY plane. The plurality of stacked conductors 24 are respectively used as the select gate lines SGDa to SGDc in this order from the semiconductor substrate 20 side. The conductor 24 contains, for example, tungsten (W).

The conductor 25 is provided on the conductor 24 via an insulating layer. The conductor 25 is formed, for example, in a linear shape extending in the Y direction, and is used as the bit line BL. In other words, a plurality of conductors 25 are arranged in the X direction in a region that is not illustrated. The conductor 25 contains, for example, copper (Cu).

The memory pillar MP is formed in a columnar shape extending in the Z direction, and penetrates through, for example, the conductors 22 to 24. Specifically, for example, the upper end of a memory pillar MP is disposed in a layer between the layer in which a conductor 24 is provided and the layer in which the conductor 25 is provided. The lower end of the memory pillar MP is disposed in, for example, the layer in which the conductor 21 is provided. In other words, the lower end of the memory pillar MP is in contact with the conductor 21 instead of penetrating through the conductor 21.

The memory pillar MP includes, for example, a core member 30, a conductor 31, and a stacked film 32. The core member 30 is formed in a columnar shape extending in the Z direction. For example, the upper end of the core member 30 is disposed in a layer between the layer in which the uppermost conductor 24 is provided and the upper end of the memory pillar MP. The lower end of the core member 30 is disposed in, for example, the layer in which the conductor 21 is provided. The core member 30 contains an insulator such as silicon dioxide ($SiO_2$).

The core member 30 is covered with the conductor 31. The conductor 31 has a portion in contact with the conductor 21 in the layer in which the conductor 21 is provided, and is electrically connected to the conductor 21. The conductor 31 is, for example, poly-silicon (Si). The side surface and lower surface of the conductor 31 are covered with the stacked film 32 except for a portion where the conductors 21 and 31 are in contact with each other.

Figure 8:
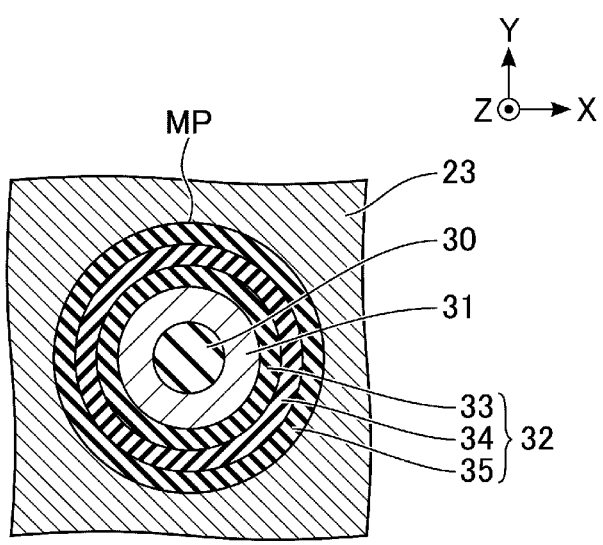
FIG. 8 illustrates a cross-sectional view of an example of a memory pillar in the semiconductor memory according to the first embodiment.

FIG. 8 illustrates an example of a cross-sectional structure of the memory pillar MP, taken parallel to a surface of the semiconductor substrate 20, including the conductor 23 used as the word line WL.

As illustrated in FIG. 8, the core member 30 is provided at the center of the memory pillar MP in the layer including the conductor 23. The conductor 31 covers the side surface of the core member 30. The stacked film 32 covers the side surface of the conductor 31. The stacked film 32 includes, for example, a tunnel oxide film 33, an insulating film 34, and a block insulating film 35.

The tunnel oxide film 33 covers the side surface of the conductor 31. The insulating film 34 covers a side surface of the tunnel oxide film 33. The block insulating film 35 covers a side surface of the insulating film 34. The conductor 23 covers the side surface of the block insulating film 35.

Referring to FIG. 7 again, a columnar contact CH is provided on the upper surface of a memory pillar MP, that is, on the conductor 31. The upper surface of a contact CH is in contact with a single conductor 25, that is, a single bit line BL.

The dummy memory pillar DMP is formed in a columnar shape extending in the Z direction, and penetrates through, for example, the conductors 22 to 24. The configuration of the dummy memory pillars DMP is the same as, for example, the configuration of the memory pillar MP, and thus a description thereof will be omitted.

The slit SLT is formed in a plate shape spreading along an XZ plane, and separates, for example, each of the conductors 22 to 24. Specifically, the upper end of the slit SLT is disposed in, for example, a layer between the layer including the upper end of the memory pillar MP and the layer in which the conductor 25 is provided. The lower end of the slit SLT is disposed in, for example, the layer in which the conductor 21 is provided. In other words, for example, the lower end of the slit SLT is in contact with the conductor 21 instead of penetrating through the conductor 21. The slit SLT contains an insulator such as silicon dioxide ($SiO_2$).

The slit SHE is formed in a plate shape spreading along the XZ plane, and separates, for example, each of the conductors 24 and a part of the dummy memory pillar DMP. Specifically, the upper end of the slit SHE is disposed in, for example, a layer between the layer including the upper end of the memory pillar MP and the layer in which the conductor 25 is provided. The lower end of the slit SHE is disposed, for example, between the layer in which the uppermost conductor 23 is provided and the layer in which the lowermost conductor 24 is provided. The slit SHE only needs to separate at least all of the conductors 24 provided in the region. The slit SHE contains an insulator such as silicon dioxide ($SiO_2$).

In the above-described configuration of the memory pillar MP, for example, a portion where the memory pillar MP intersects the conductor 22 functions as the select transistor ST2. Respective portions where the memory pillar MP intersects the plurality of conductors 23 function as the memory cell transistors MT0 to MT7. Respective portions where the memory pillar MP intersects the plurality of conductors 24 function as the select transistors ST1a to ST1c.

In other words, the conductor 31 in the memory pillar MP functions as a channel of the memory cell transistor MT and also of the select transistors ST1 and ST2. The insulating film 34 functions as a charge storage layer of the memory cell transistor MT.

Figure 9:
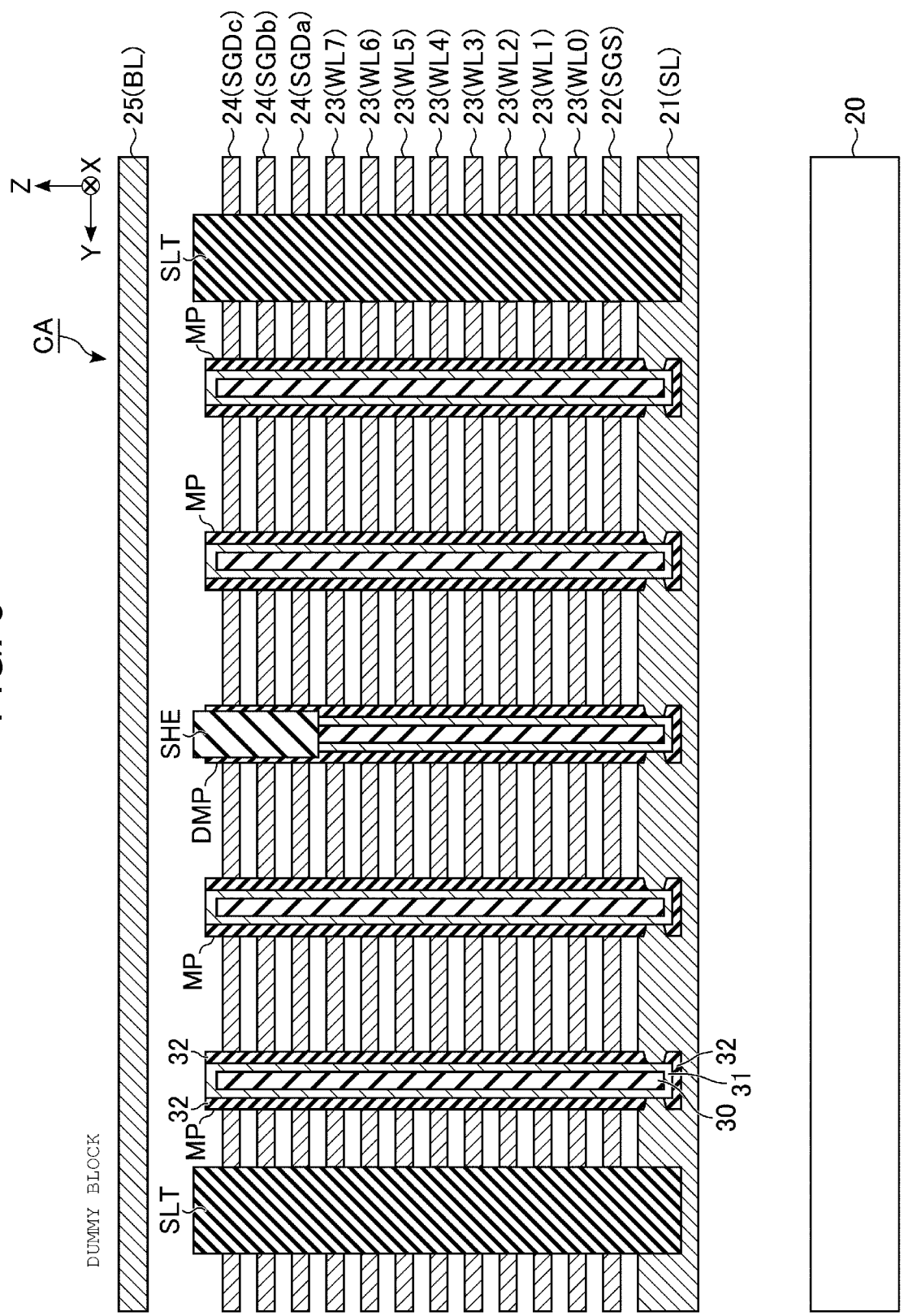
FIG. 9 illustrates a cross-sectional view of an example of the cell region of the memory cell array of the semiconductor memory according to the first embodiment.

FIG. 9 illustrates an example of a cross-sectional structure of the memory cell array 10 in a region corresponding to the dummy block DBLK in the cell region CA.

As illustrated in FIG. 9, the region corresponding to the dummy block DBLK in the cell region CA includes, for example, the conductors 21 to 25, the memory pillars MP, the dummy memory pillars DMP, and the slits SLT and SHE. The structure of the dummy block DBLK is the same as a structure in which, for example, the contact CH is omitted from the active block ABLK.

For example, the dummy block DBLK in the cell region CA preferably does not include the contact CH in the active block ABLK, but may include the contact CH. In other words, in the dummy block DBLK, the memory pillar MP may or not be electrically connected to the conductor 25.

In the active block ABLK, the memory pillar MP may be electrically connected to the conductor 25 via two or more contacts, or else may be electrically connected thereto via other wirings. In this case, in the dummy block DBLK, the same contact and wiring as those in the active block ABLK may be formed between the memory pillar MP and the conductor 25, or else a structure in which some of the contacts and the wirings provided in the active block ABLK are omitted may be formed. The memory pillar MP may be provided in the dummy block DBLK in the same as in the active block ABLK, or else may not be provided.

Structure of Memory Cell Array 10 in Lead Region HA

Figure 10:
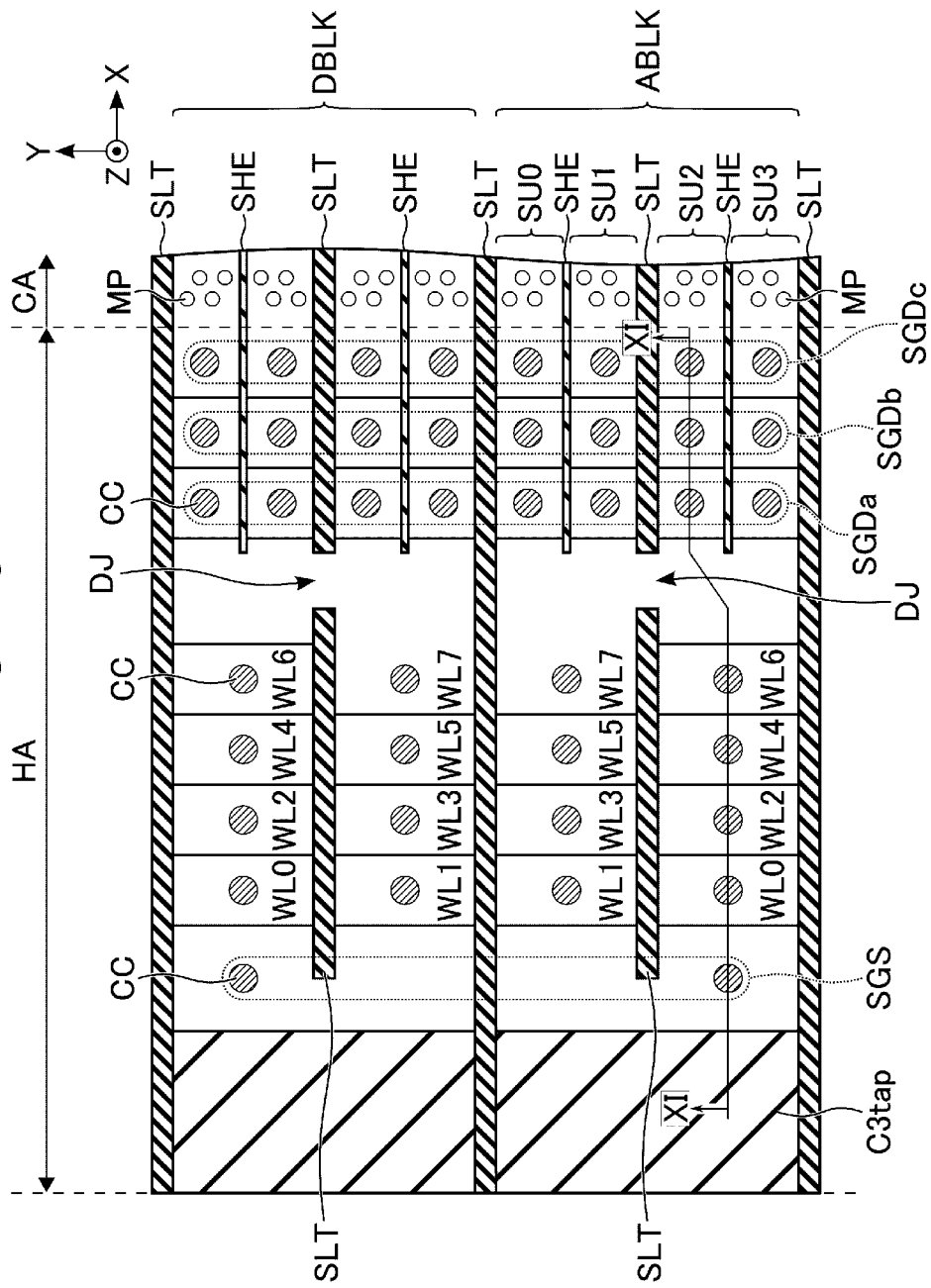
FIG. 10 illustrates a plan view of an example of a lead region of the memory cell array of the semiconductor memory according to the first embodiment.

FIG. 10 illustrates an example of a planar layout of the lead region HA of the memory cell array 10 of the semiconductor memory 1 according to the first embodiment by extracting one active block ABLK and one dummy block DBLK.

As illustrated in FIG. 10, in the region of the active block ABLK in the lead region HA, a plurality of conductors respectively corresponding to the select gate line SGS, the word lines WL0 to WL7, and the select gate line SGD have portions (terrace portions) not covered by the conductor above.

For example, a plurality of conductors 24 respectively corresponding to the select gate lines SGDa, SGDb, and SGDc are provided in a stepped formation in which the step differences are formed in the X direction. In the lead region HA, the horizontal-direction slit SLT in the active block ABLK separates the select gate lines SGDa, SGDb, and SGDc. The slit SHE also separates the select gate lines SGDa, SGDb, and SGDc.

In this example, in the active block ABLK, each of the select gate lines SGDa, SGDb, and SGDc is separated into four sublines by the slits SLT and SHE. The four separated sublines of select gate lines SGD (that is, four sets of SGDa, SGDb, and SGDc segments) respectively correspond to the string units SU0 to SU3.

For example, a plurality of conductors 23 respectively corresponding to the word lines WL0 to WL7 have one step differences between them extending in the Y direction, and make up a stairway with step differences of two layers in the X direction. The slit gap DJ provided in the horizontal-direction slit in the active block ABLK is disposed in, for example, the terrace portion of the word line WL7. The word lines WL provided in the same layer in the same active block ABLK are short-circuited to each other via the slit gap DJ.

The conductor 22 corresponding to the select gate line SGS is led in the X direction from, for example, end part regions of the word lines WL0 and WL1. The horizontal-direction slit SLT in the active block ABLK either may or may not separate the select gate line SGS.

In the active block ABLK, for example, contacts CC are provided on the terrace portions of the select gate line SGS, the word lines WL0 to WL7, and the select gate lines SGDa, SGDb, and SGDc.

For example, a C3 connection region C3tap is provided in an end part sub-region in the X direction within a region between the two horizontal-direction slits SLT in contact with the active block ABLK. The C3 connection region C3tap is a region in which a contact (not illustrated) for connecting a wiring provided on the memory cell array 10 to a wiring provided under the memory cell array 10 is provided.

Each of the select gate line SGS, the word lines WL0 to WL7, and the select gate line SGD is electrically connected to the row decoder module 15 provided under the memory cell array 10 via a contact penetrating through the corresponding contact CC and the C3 connection region C3tap.

The C3 connection region C3tap may be provided outside the region interposed between the horizontal-direction slits SLT. In the lead region HA, the horizontal-direction slit SLT provided between the blocks BLK adjacent to each other should separate at least the conductor 22 corresponding to the select gate line SGS. Thus, the C3 connection region C3tap may not be provided interposed between the horizontal-direction slits SLT, depending on the layout of the memory cell array 10.

The rest of the planar layout of the dummy block DBLK in the lead region HA is the same as the planar layout obtained by inverting the planar layout of the active block ABLK adjacent thereto, and thus a description thereof will be omitted.

Figure 11:
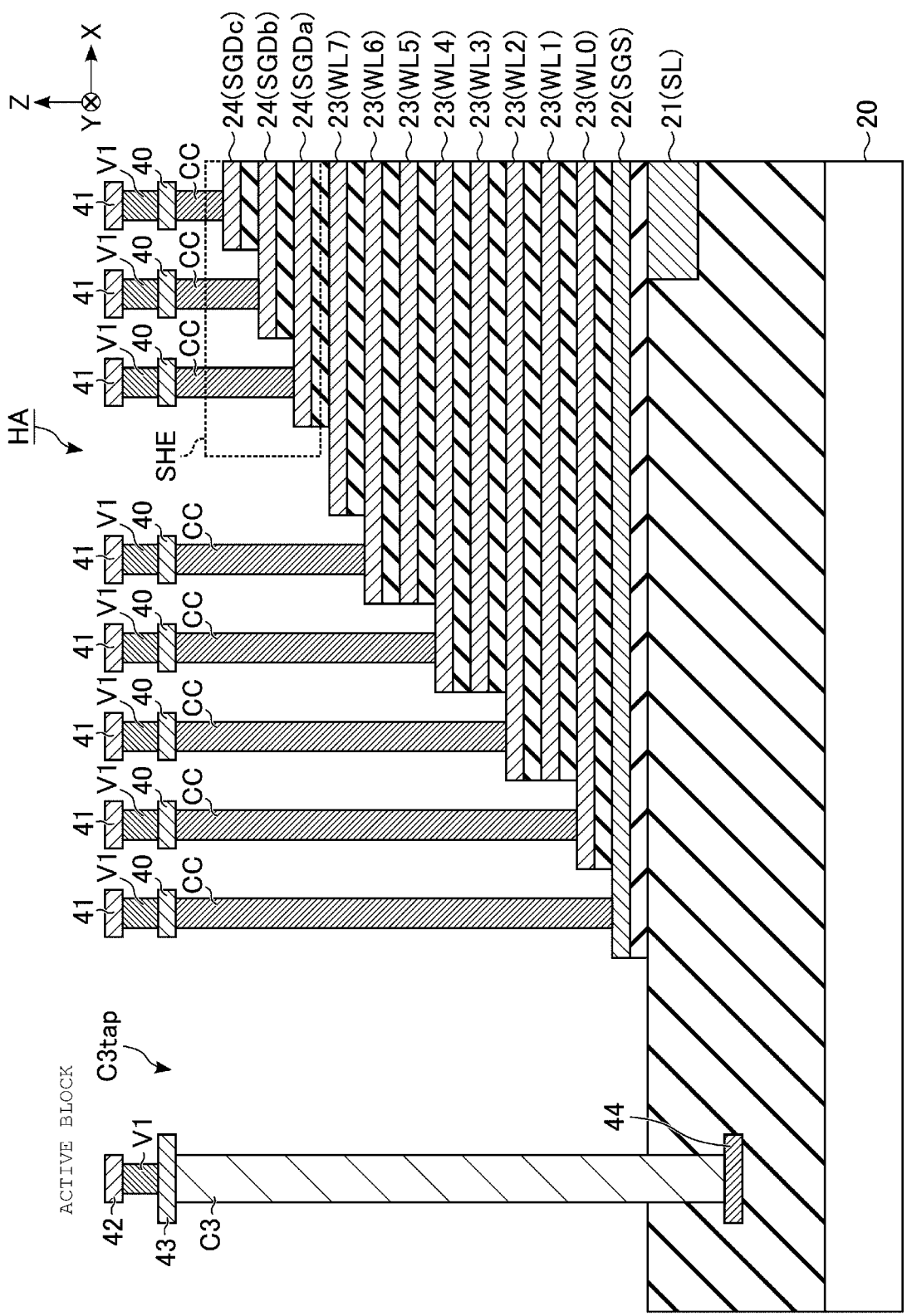
FIG. 11 illustrates a cross-sectional view of an example of the lead region of the memory cell array of the semiconductor memory according to the first embodiment.

FIG. 11 illustrates a cross-sectional view of the memory cell array 10 taken along the line IX-IX in FIG. 10, and illustrates an example of a cross-sectional structure of the memory cell array 10 in the region corresponding to the active block ABLK in the lead region HA.

As illustrated in FIG. 11, the region corresponding to the active block ABLK in the lead region HA includes, for example, the conductors 21 to 24, conductors 40 to 44, and contacts CC, V1, and C3.

The end parts of the conductor 22, the conductor 23, and the conductor 24 respectively corresponding to the select gate line SGS, the word line WL, and the select gate line SGD are provided in a stepped form as described above. In other words, in the lead region HA, each end part of the conductors 22 to 24 has at least a portion not overlapping the overlying conductor 23 or conductor 24. The end part of the conductor 21 need not be extended beyond the conductor 22 in the lead region HA.

Each contact CC is formed in a columnar shape extending in the Z direction. The contact CC includes, for example, a conductor formed in a columnar shape. A spacer may be provided on the side surface of the columnar conductor provided in the contact CC. The conductor in the contact CC contains, for example, tungsten (W), and the spacer contains, for example, silicon dioxide ($SiO_2$).

The respective conductors 40 to 44 are wirings connecting the conductors 22 to 24 led to the lead region HA from the cell region CA, as described above, to the row decoder module 15. A plurality of conductors 40 are respectively provided on a plurality of contacts CC. A plurality of contacts V1 are respectively provided on the plurality of conductors 40. A plurality of conductors 41 are respectively provided on the plurality of contacts V1.

The conductor 41 is electrically connected to, for example, the corresponding conductor 42. The conductor 42 is electrically connected to the conductor 43 provided in the same layer as the conductor 40 in the C3 connection region C3tap, via for example the contact V1. The conductor 43 is electrically connected to the conductor 44 provided in a layer below the conductor 21 via, for example, the contact C3 in the C3 connection region C3tap. The conductor 44 is electrically connected to the row decoder module 15 via a contact and a wiring (not illustrated).

The conductors 40 and 43 may be formed in the same layer, and may be formed in different layers. The conductors 41 and 42 may be formed in the same layer, and may be formed in different layers. The corresponding conductors 40 and 41 may be connected to each other via a plurality of contacts, and different wirings may connect a plurality of contacts.

In FIG. 11, the position of the slit SHE provided in the depth direction of this cross-sectional view is illustrated by a dashed line. As illustrated in FIG. 11, the slit SHE in the active block ABLK separates the plurality of conductors 24 respectively corresponding to the select gate lines SGDa, SGDb, and SGDc in the lead region HA.

Figure 12:
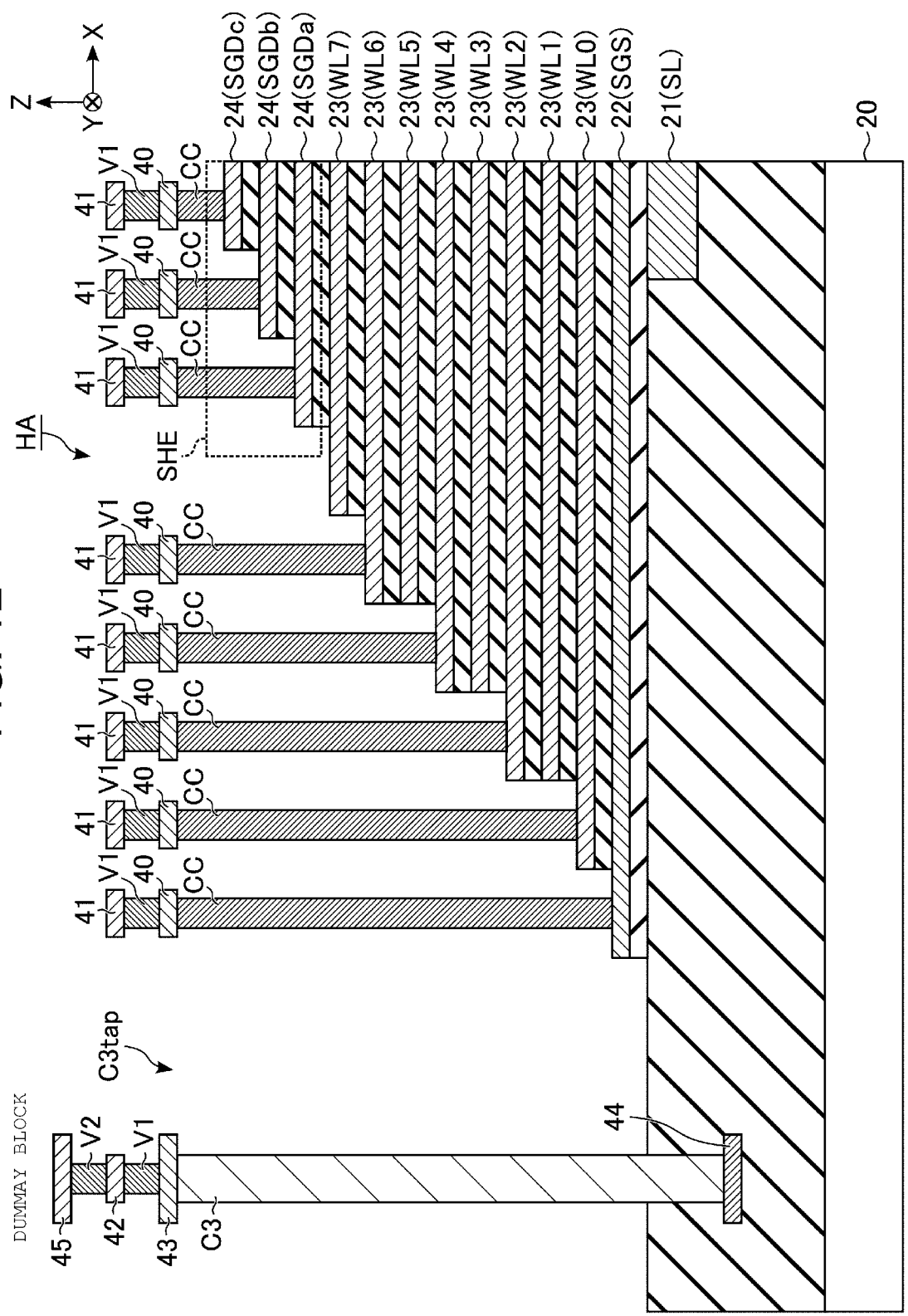
FIG. 12 illustrates a cross-sectional view of an example of the lead region of the memory cell array of the semiconductor memory according to the first embodiment.

FIG. 12 illustrates an example of a cross-sectional structure of the memory cell array 10 in the region corresponding to the dummy block DBLK in the lead region HA.

As illustrated in FIG. 12, the region corresponding to the dummy block DBLK in the lead region HA includes, for example, the conductors 21 to 24, the conductors 40 to 45, and the contacts CC, V1, V2, and C3.

The conductor 45 is used as, for example, a micro-pad. The micro-pad is a pad used in, for example, an inspection process. The conductor 45 is electrically connected to the corresponding conductor 42 via the contact V2. In other words, various wirings laid out in the dummy block DBLK are electrically connected to, for example, the micro-pad.

In FIG. 12, the position of the slit SHE provided in the depth direction of this cross-sectional view is illustrated by the dashed line. As illustrated in FIG. 12, in the lead region HA, the slit SHE in the dummy block DBLK separates the plurality of conductors 24 respectively corresponding to the select gate lines SGDa, SGDb, and SGDc.

The rest of the structure of the dummy block DBLK in the lead region HA is the same as, for example, the structure of the active block ABLK in the lead region HA, and thus a description thereof will be omitted.

The conductors 45 and 42 may be connected to each other via position contacts and wirings. The conductor 45 may be exposed to a chip surface of the semiconductor memory 1. The various wirings laid out in the dummy block DBLK either may or may not be connected to circuits provided in a lower layer of the conductor 21. In other words, in the dummy block DBLK, the conductors 43 and 44 and the contact C3 may be omitted.

In the above description, a description has been made of an example where the word line WL of the active block ABLK is connected to the row decoder module 15 under the memory cell array 10 via the C3 connection region C3tap, but the structure is not limited to this. For example, the contact CC connected to the end part of the conductor 23 (that is, the word line WL) may be electrically connected to the row decoder module 15 under the memory cell array 10 via a contact which penetrates through stacked wirings (for example, a plurality of conductors 23) of the dummy block DBLK in the lead region HA.

The contact CC connected to the end part of the conductor 23 may be electrically connected to the row decoder module 15 under the memory cell array 10 via a contact which penetrates through stacked wirings (for example, a plurality of conductors 23) of the active block ABLK in the lead region HA. In a case where the horizontal-direction slit SLT is provided at the other end part of the block group BLKG in the X direction, the C3 connection region C3tap may be provided in a region outside the region surrounded by the vertical-direction slit and the horizontal-direction slits.

Structure of Memory Cell Array 10 in Vicinity of Plane Separation Region PNdiv

Figure 13:
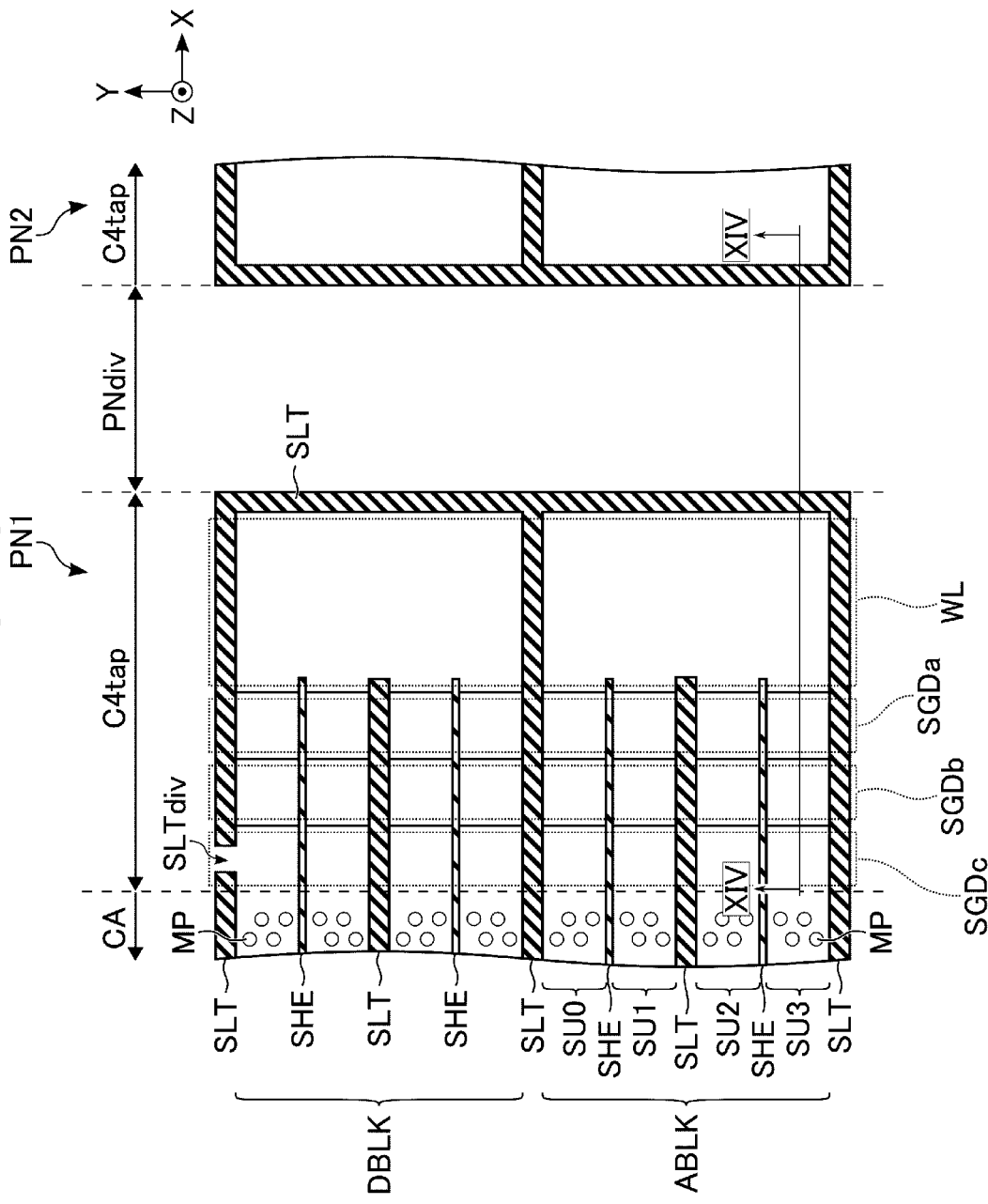
FIG. 13 illustrates a plan view of an example of the vicinity of a plane separation region of the semiconductor memory according to the first embodiment.

FIG. 13 illustrates an example of a planar layout of the vicinity of the plane separation region PNdiv of the semiconductor memory 1 according to the first embodiment by extracting one active block ABLK and one dummy block DBLK. In the following, the C4 connection region C4tap of the plane PN1 will be focused on.

As illustrated in FIG. 13, in the C4 connection region C4tap, a plurality of conductors 24 respectively corresponding to the select gate lines SGDa, SGDb, and SGDc and the conductor 23 corresponding to the uppermost word line WL have portions (terrace portions) not covered by the conductor above.

For example, in the active block ABLK, the plurality of conductors 24 respectively corresponding to the select gate lines SGDa, SGDb, and SGDc are provided in a stepped form in which a step difference is formed in the X direction. In the C4 connection region C4tap, the horizontal-direction slit SLT in the active block ABLK separates the select gate lines SGDa, SGDb, and SGDc. Similarly, the slit SHE separates the select gate lines SGDa, SGDb, and SGDc.

The horizontal-direction slit SLT disposed in the active block ABLK is not in contact with the vertical-direction slit SLT. In other words, the word lines WL provided in the same layer in the C4 connection region C4tap are short-circuited to each other across the string units SU0 to SU3.

In this example, in the C4 connection region C4tap, a single slit gap SLTdiv is provided between the dummy block DBLK and the peripheral region of the block group BLKG. The rest of the planar layout of the dummy block DBLK in the C4 connection region C4tap is the same as a planar layout obtained by inverting the planar layout of the active block ABLK adjacent thereto, and thus a description thereof will be omitted.

Figure 14:
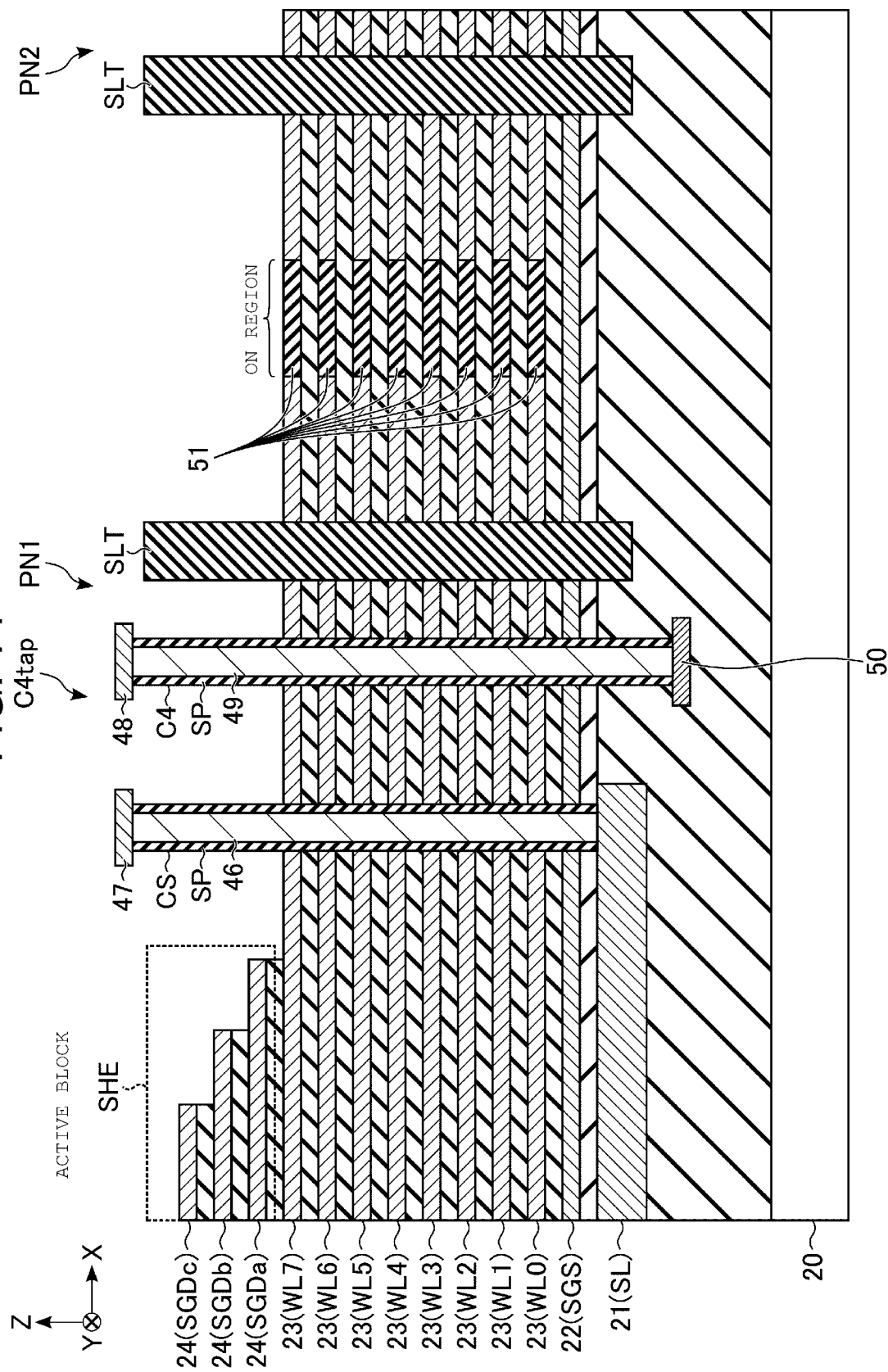
FIG. 14 illustrates a plan view of an example of the vicinity of the plane separation region of the semiconductor memory according to the first embodiment.

FIG. 14 illustrates a cross-sectional view of the memory cell array 10 taken along the line XIV-XIV in FIG. 13, and illustrates an example of a cross-sectional structure of the memory cell array 10 including a region corresponding to the active block ABLK in the vicinity of the plane separation region PNdiv. In the following, the C4 connection region C4tap of the plane PN1 will be focused on.

As illustrated in FIG. 14, the region corresponding to the active block ABLK in the C4 connection region C4tap includes, for example, the conductors 21 to 24, conductors 47, 48, and 50, and contacts CS and C4.

The end part of the conductor 21 in the plane PN1 extends, for example, from the cell region CA to the middle of the C4 connection region C4tap. Each of the conductors 22 and 23 are separated by the vertical-direction slit SLT, and is in contact with the vertical-direction slit SLT. A plurality of conductors 24 respectively corresponding to the select gate lines SGDa, SGDb, and SGDc are provided, for example, in a stepped form in the same manner as in the lead region HA. This is only an example, and, in the C4 connection region C4tap, the plurality of conductors 24 respectively corresponding to the select gate lines SGDa, SGDb, and SGDc need not be provided in a stepped form.

In the C4 connection region C4tap, the columnar contact CS is provided on the conductor 21, and the contact CS includes a conductor 46 and a spacer SP. The conductor 46 is provided in a columnar shape, and a lower end thereof is in contact with the conductor 21. The spacer SP is provided on the side surface of the conductor 46.

The conductor 47 is provided on the contact CS, that is, on the conductor 46. The conductor 47 is electrically connected to, for example, the conductor 48 provided in the same layer in the C4 connection region C4tap.

The conductor 48 is electrically connected to the conductor 50 provided in a lower layer of the conductor 21 via the contact C4. The contact C4 includes a conductor 49 and a spacer SP. The conductor 49 is provided in a columnar shape, and has a lower end in contact with the conductor 50 and an upper end in contact with the conductor 48. The spacer SP is provided on the side surface of the conductor 49. The conductor 50 is electrically connected to a circuit provided under the memory cell array 10.

In FIG. 14, a set of the contacts CS and C4 is illustrated, but the C4 connection region C4tap may include a plurality of contacts CS and C4, and may include a plurality of conductors 47, 48, and 50. In this case, the conductor 21 is electrically connected to the corresponding conductor 50 via a combination of the contacts CS and C4 and the conductors 47 and 48.

A wiring layer in which the conductor 23 is provided includes a region (for example, an ON region) in which insulators 51 are provided, in the region (that is, the plane separation region PNdiv) between the vertical-direction slit corresponding to the plane PN1 and the vertical-direction slit corresponding to the plane PN2. The insulators 51 are provided in a portion separated from the slit SLT. Each of the insulators 51 contains, for example, silicon nitride (SiN).

In FIG. 14, the position of the slit SHE provided in the depth direction of this cross-sectional view is illustrated by the dashed line. As illustrated in FIG. 14, the slit SHE in the active block ABLK separates the plurality of conductors 24 respectively corresponding to the select gate lines SGDa, SGDb, and SGDc in the C4 connection region C4tap.

Figure 15:
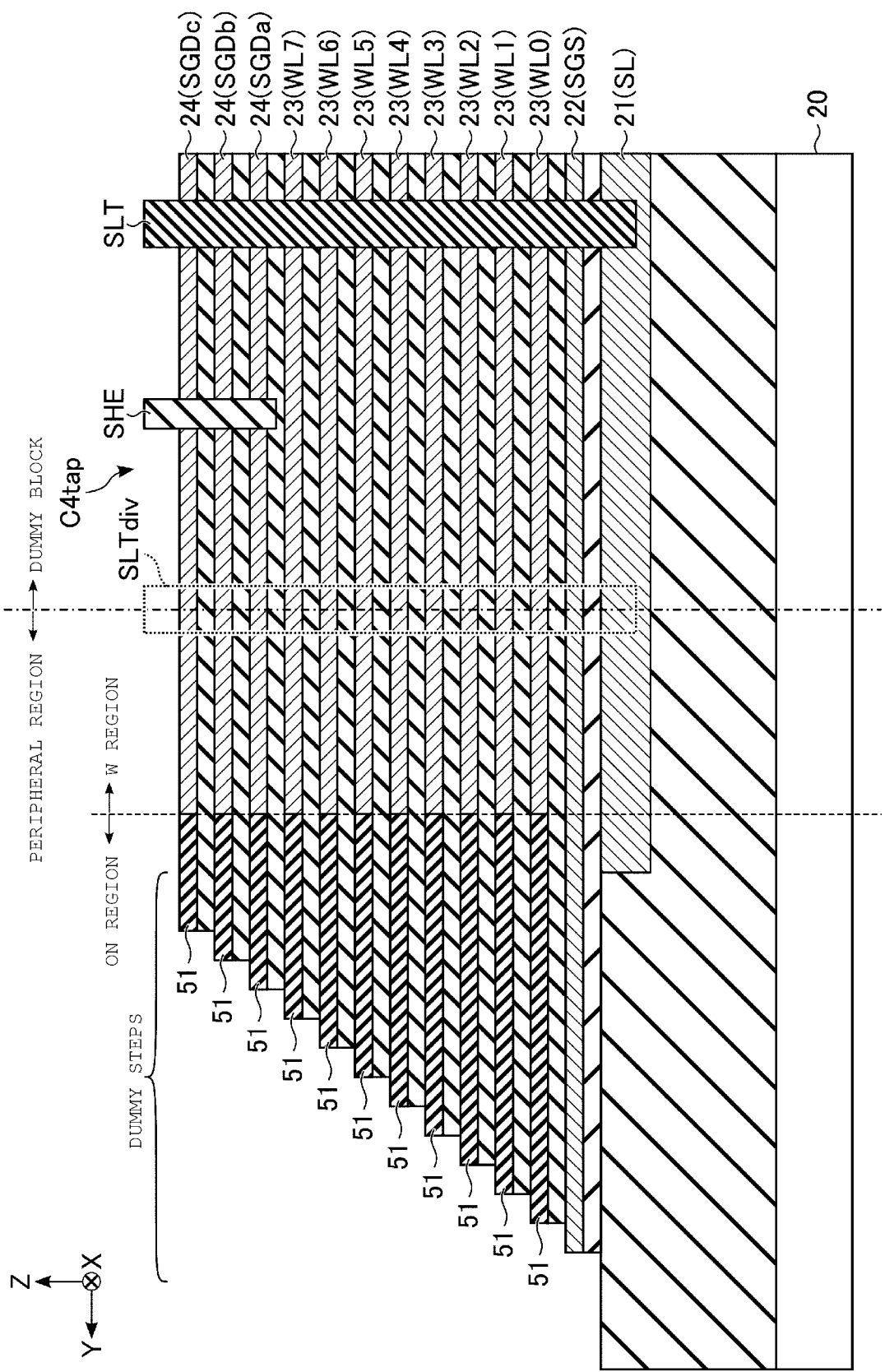
FIG. 15 illustrates a cross-sectional view of an example of the memory cell array in a region including a dummy block and a peripheral region of a block group in the semiconductor memory according to the first embodiment.

FIG. 15 is a cross-sectional view of the memory cell array along the Y direction including the slit gap SLTdiv illustrated in FIG. 13, and illustrates an example of a cross-sectional structure of the memory cell array 10 including a peripheral region of the block group BLKG and a region of the dummy block DBLK.

As illustrated in FIG. 15, each of the conductors 22, 23, and 24 is continuously provided between the dummy block DBLK and the peripheral region of the block group BLKG via the slit gap SLTdiv. In other words, each of the word lines WL0 to WL7 provided in the dummy block DBLK in contact with the slit gap SLTdiv is short-circuited to the conductor 23 provided in the same layer in the peripheral region.

An ON region is formed in a portion of the peripheral region separated from the slit SLT. Specifically, in the ON region, insulators 51 are provided in layers in which the conductors 23 and 24 are provided. For example, dummy steps are formed in the peripheral region. The dummy steps are stepped portions formed when stepped portions of the lead region HA are processed. In this example, the dummy steps are formed in the ON region of the peripheral region, and a plurality of insulators 51 are provided in a stepped form.

The conductor 21 should be provided in at least the dummy block DBLK among the regions illustrated in FIG. 15, and any range thereof in the peripheral region may be designed.

The rest of the structure of the dummy block DBLK in the C4 connection region C4tap is the same as, for example, the structure of the active block ABLK in the C4 connection region C4tap, and thus a description thereof will be omitted. In the above description, the structure of the memory cell array 10A corresponding to the plane PN1 has been described, and the structure of the plane PN2 is the same as a structure obtained by inverting, for example, the structure of the plane PN1 about the Y direction symmetry axis, and thus a description thereof will be omitted.

Figure 16:
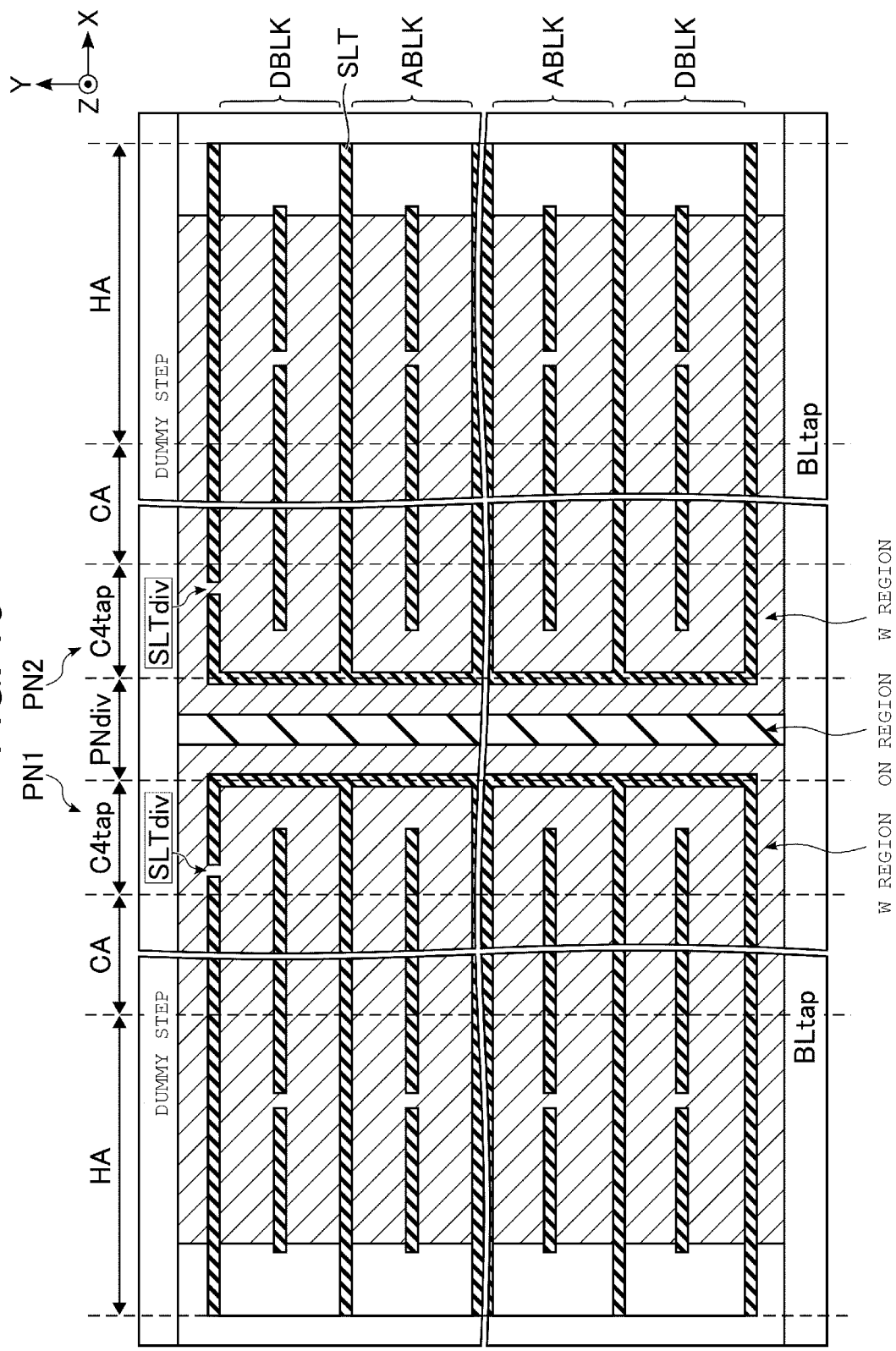
FIG. 16 illustrates a plan view of an example of the memory cell array according to of the first embodiment.

FIG. 16 illustrates a planar layout of the memory cell array 10 by extracting two block groups BLKG in the planes PN1 and PN2 that are adjacent to each other. In these blocks in FIG. 16, the ON region and the W region are hatched differently. The W region illustrated in FIG. 16 corresponds to a region in which, for example, the conductor 23 corresponding to the word line WL0 is provided.

As illustrated in FIG. 16, for example, the block groups BLKG adjacent to each other between the planes PN1 and PN2 are interposed between the region of the dummy steps provided on one side in the Y direction and the BL connection region BLtap provided on the other side in the Y direction. In other words, the W region provided in both the planes PN1 and PN2 is, for example, in contact with the region of the dummy steps on one side in the Y direction and is in contact with the BL connection region BLtap on the other side in the Y direction.

In the plane separation region PNdiv, W regions of both the planes PN1 and PN2 are provided along the vertical-direction slits SLT in contact with the plane separation region PNdiv. Thus, the conductors 23 (that is, the W region) in the plane separation region PNdiv that are adjacent to the dummy blocks DBLK and the active blocks ABLK via the vertical-direction slits SLT, are electrically connected to the conductors 23 in the same layers in the dummy block DBLK via the slit gap SLTdiv.

Specifically, in the layer in which the word line WL0 is provided in the plane PN1, the conductor 23 provided in the peripheral region and the conductor 23 in the plane separation region PNdiv in contact with the vertical-direction slit SLT in the plane PN1 are joined. The conductor 23 provided in the peripheral region and the conductor 23 in the dummy block DBLK are joined via the conductor 23 provided in the plane separation region PNdiv.

The ON region is provided between the W region of the plane PN1 and the W region of the plane PN2. As described above, in the first embodiment, the conductor 23 in the plane PN1 is insulated from the conductor 23 in the plane PN2. The above-described structure is similarly formed for the other word lines WL1 to WL7.

In the structure of the memory cell array 10 described above, the number of conductors 23 is designed based on the number of word lines WL. A plurality of conductors 22 provided in a plurality of layers may be allocated to the select gate lines SGS. When the select gate lines SGS are provided in a plurality of layers, a conductor which is different from the conductor 22 may be used.

A region of dummy steps may be provided between the dummy block DBLK and the BL connection region BLtap provided on the other side in the Y direction. For example, when a region of dummy steps is not provided between the dummy block DBLK and the BL connection region BLtap, for example, the same stacked structure as in the ON region is formed in the BL connection region. In this case, for example, the contact C4 penetrating through the stacked structure is provided in the BL connection region BLtap, and thus the bit line BL is electrically connected to a wiring under the memory cell array 10.

On the other hand, when a region of dummy steps is provided between the dummy block DBLK and the BL connection region BLtap, for example, the same insulating layer as in the C3 connection region C3tap is formed in the BL connection region. In this case, for example, the contact C3 penetrating through the insulating layer is provided in the BL connection region BLtap, and thus the bit line BL is electrically connected to a wiring under the memory cell array 10.

1-2. Effect of First Embodiment

According to the semiconductor memory 1 of the first embodiment described above, it is possible to detect a short circuit failure in the word line WL. In the following, details of the effect will be described.

In a manufacturing process for a semiconductor memory in which memory cells are stacked in a three-dimensional manner, when a stacked wiring such as the word line WL is formed, first, a stacked body in which a replacement member and an insulating film are alternately stacked is formed. For example, a slit for partitioning the block BLK is formed, and removal of the replacement member and formation of a conductor are performed in order by using the slit. Thereafter, for example, an insulator is buried in the slit. A stacked wiring formed through the replacement process is used as a wiring such as the word line WL connected to a NAND string.

Regarding defects occurring when the above-described manufacturing method is used, there may be a short circuit failure in a word line occurring due to an unintended closed portion being formed during formation of a slit. For example, a replacement member which is required to be separated remains unseparated in a location where a slit is closed, that is, a stacked body is not separated. When a replacement process is performed in this state, a wiring in the block group BLKG may be short-circuited to a conductor outside the block group BLKG in the location where the replacement member remains.

Such a short circuit failure caused by a slit is likely to occur in the vertical-direction slit SLT provided between planes adjacent to each other. The word line WL of the active block ABLK in which a short circuit failure occurs may have a characteristic difference from the word line WL of the active block ABLK in which there is no short circuit failure, and thus this may influence the reliability of data of the semiconductor memory 1.

In the semiconductor memory 1 according to the first embodiment, in order to detect a short circuit failure occurring via the region of the vertical-direction slit SLT, the slit gap SLTdiv is provided in a part of the slit SLT separating the dummy block DBLK from the block group BLKG.

Figure 17:
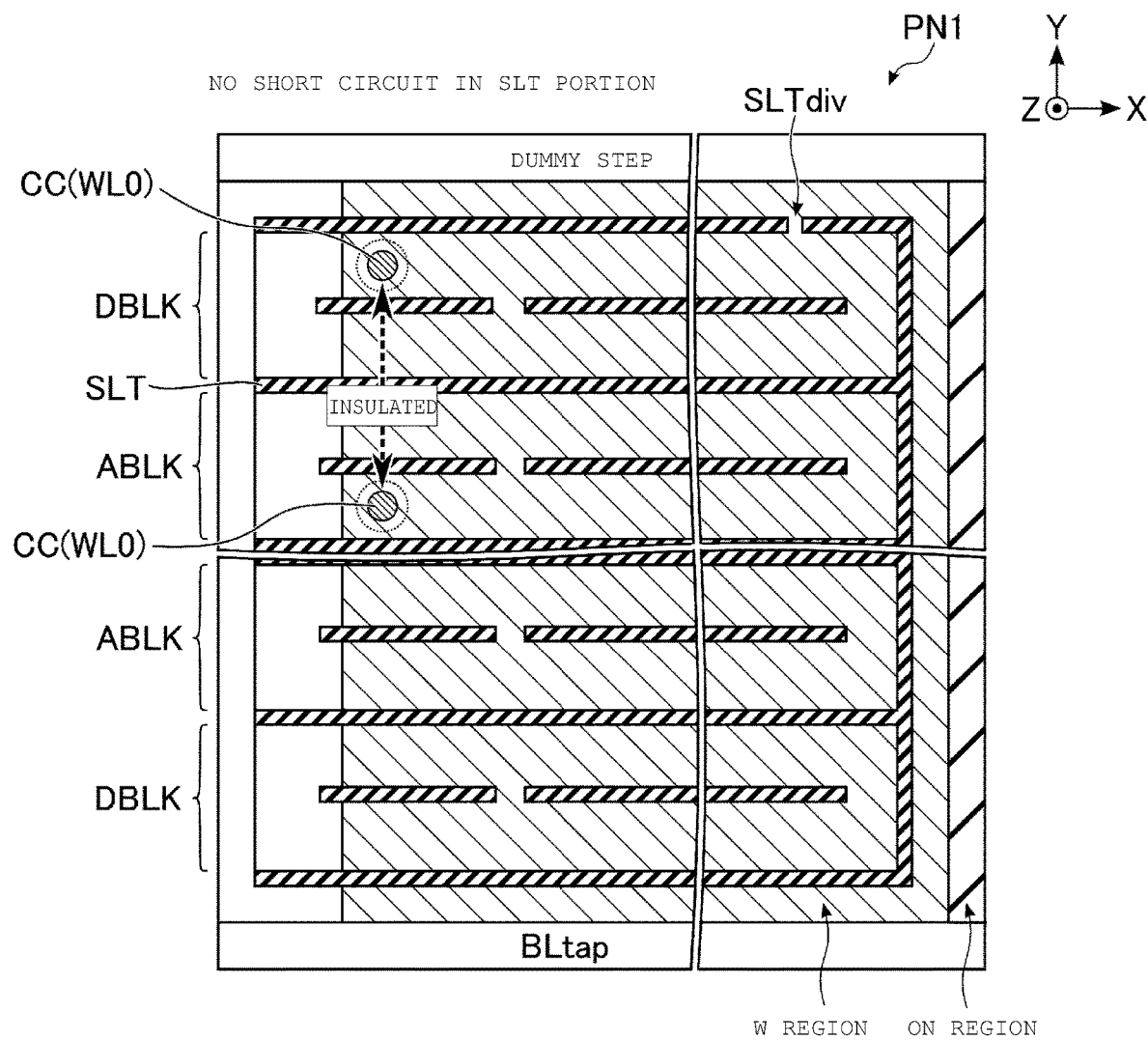
FIG. 17 is a diagram to explain a relationship between contacts respectively provided in an active block and the dummy block when a short circuit does not occur in a slit portion in the semiconductor memory according to the first embodiment.
Figure 18:
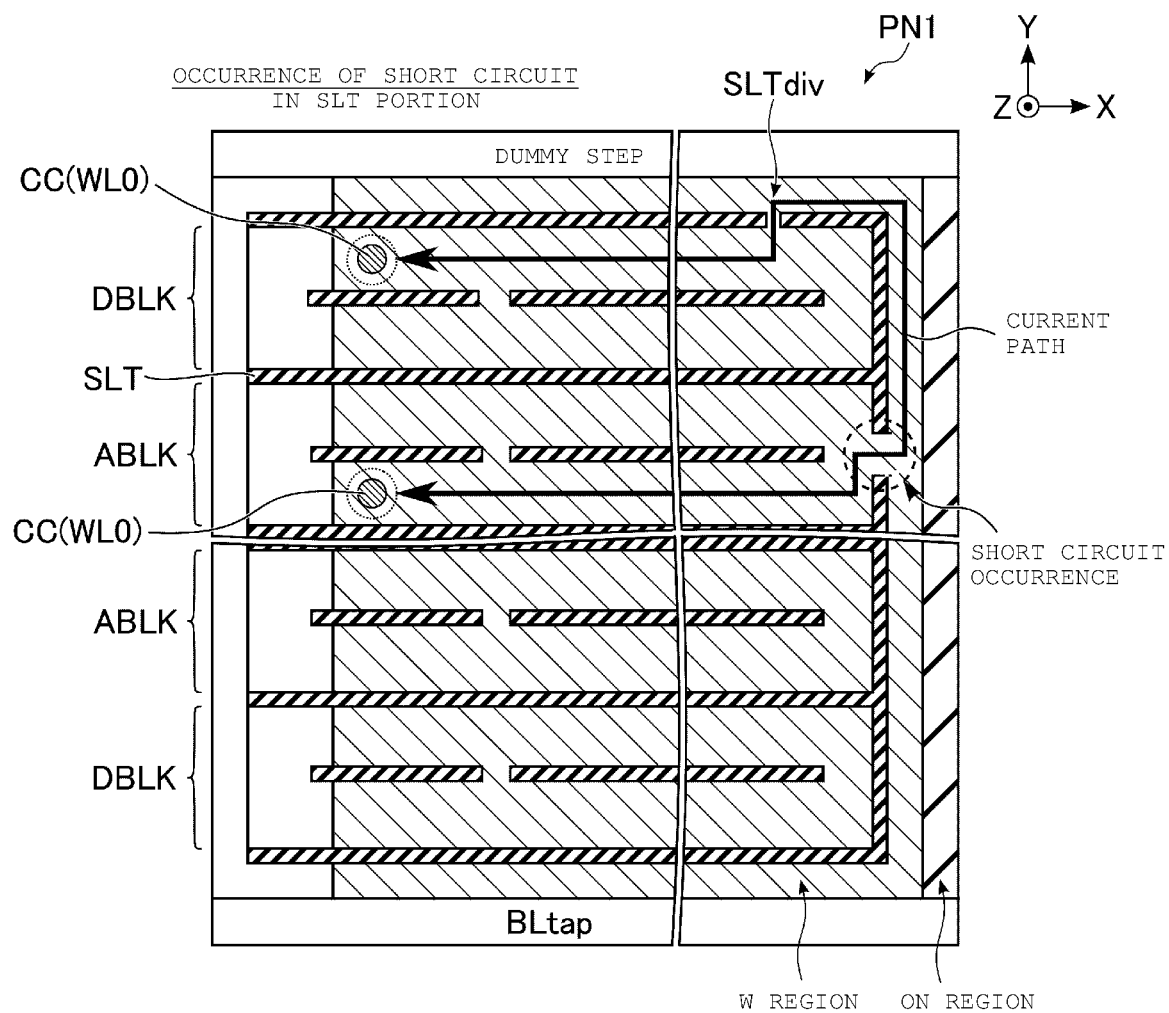
FIG. 18 is a diagram to explain a relationship between contacts respectively provided in the active block and the dummy block when a short circuit occurs in the slit portion in the semiconductor memory according to the first embodiment.

FIGS. 17 and 18 illustrate positions of the W region of the conductor 23 corresponding to the word line WL0 and the slit SLT separating the conductor 23 in a planar layout of a single block group BLKG in the plane PN1 according to the first embodiment.

FIGS. 17 and 18 illustrate the contact CC corresponding to the word line WL0 of the dummy block DBLK in contact with the slit gap SLTdiv and the contact CC corresponding to the word line WL0 of the active block ABLK adjacent to the dummy block DBLK.

As illustrated in FIG. 17, when a short circuit failure does not occur in the slit SLT in contact with the peripheral region of the block group BLKG, the contact CC connected to the word line WL0 of the dummy block DBLK is insulated from the contact CC connected to the word line WL0 of the active block ABLK near the dummy block DBLK.

On the other hand, as illustrated in FIG. 18, when a short circuit failure occurs in the vertical-direction slit SLT between the W region outside the block group BLKG and the active block ABLK, the illustrated current path is formed. Specifically, the contact CC connected to the word line WL0 of the active block ABLK is short-circuited to the contact CC connected to the word line WL0 of the dummy block DBLK via the slit gap SLTdiv, the W region provided outside the block group BLKG, and the short circuit occurrence location of the vertical-direction slit SLT.

As a method of detecting a short circuit failure caused by the vertical-direction slit SLT, for example, the resistance value between the contact CC of the dummy block DBLK and the contact CC of the active block ABLK is measured. When the two contacts CC are in a high resistance state, it is determined that a short circuit failure is not present, and when the contacts CC are in a low resistance state, it is determined that a short circuit failure is present.

As described above, in the semiconductor memory 1 according to the first embodiment, the state between the contact CC connected to a wiring in the dummy block DBLK and the contact CC connected to a wiring in the active block ABLK is examined, and thus it is possible to detect whether or not a short circuit failure has occurred between the active block ABLK and the peripheral region thereof.

As a result, in the semiconductor memory 1 according to the first embodiment, a short circuit failure caused by the slit SLT can be detected, and thus it is possible to minimize the occurrence of acquired defects or performance variation in the semiconductor memory 1.

Figure 19:
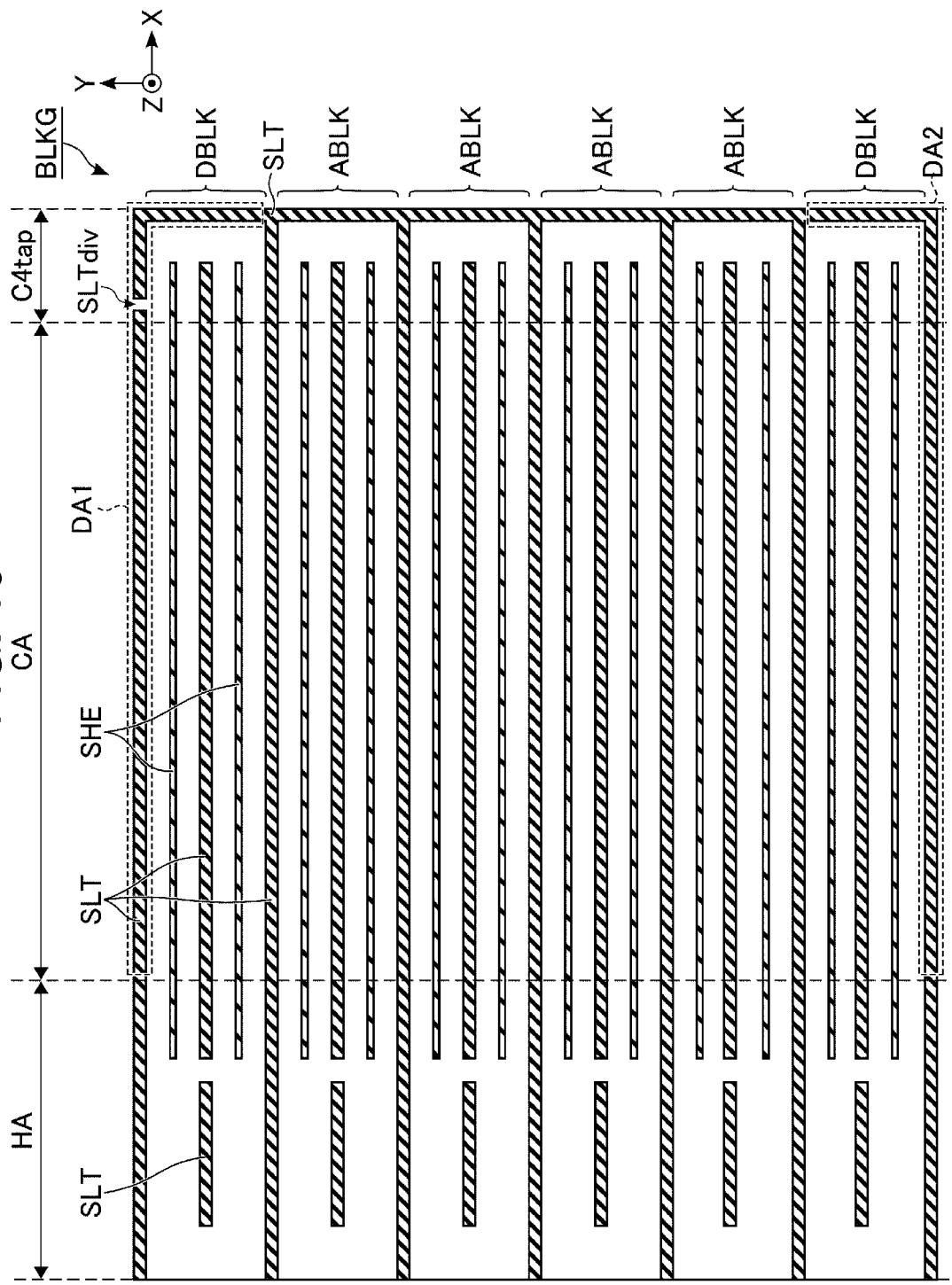
FIG. 19 illustrates a plan view of the memory cell array to illustrate an example of a region in which a slit gap can be provided in the semiconductor memory according to the first embodiment.

The slit gap SLTdiv may be provided in, for example, the slit SLT between the dummy block DBLK and the peripheral region of the block group BLKG in the cell region CA. FIG. 19 illustrates a specific example of a region in a planar layout of the memory cell array 10 in the first embodiment in which the slit gap SLTdiv is provided.

As illustrated in FIG. 19, in the first embodiment, the slit gap SLTdiv may be provided in either a region DA1 of the slit SLT in contact with the dummy block DBLK provided on one side of the block group BLKG in the Y direction or a region DA2 of the slit SLT in contact with the dummy block DBLK provided on the other side of the block group BLKG in the Y direction, or both.

The slit gap SLTdiv is preferably separated from a corner portion of the block group BLKG, that is, a portion where the vertical-direction slit SLT and a horizontal-direction slit SLT facing outside intersect each other. The slit gap SLTdiv is more preferably provided in the horizontal-direction slit SLT than in the vertical-direction slit SLT.

The semiconductor memory 1 according to the first embodiment has a structure in which the two planes PN1 and PN2 (that is, the memory cell arrays 10A and 10B) are adjacent to each other in the X direction. In both the planes PN1 and PN2, the C4 connection region C4tap is provided in the portion in contact with the plane separation region PNdiv between the two planes PN1 and PN2. In other words, in the semiconductor memory 1 according to the first embodiment, the lead region HA of both the planes PN1 and PN2 is provided on only one side in the X direction unlike in the comparative example.

As a result, in the semiconductor memory 1 according to the first embodiment, it is possible to reduce the area occupied by the lead region HA compared with a case where two planes in which the lead regions HA have a stepped structure are adjacent to each other on both sides in the X direction as in the comparative example. Therefore, the semiconductor memory 1 according to the first embodiment can prevent an increase of chip area of the semiconductor memory 1 having a plurality of planes.

1-3. Modification Example of First Embodiment

In the semiconductor memory 1 according to the first embodiment described above, a wiring resistance in the active block ABLK can be estimated by taking care in the position of the slit gap SLTdiv.

Figure 20:
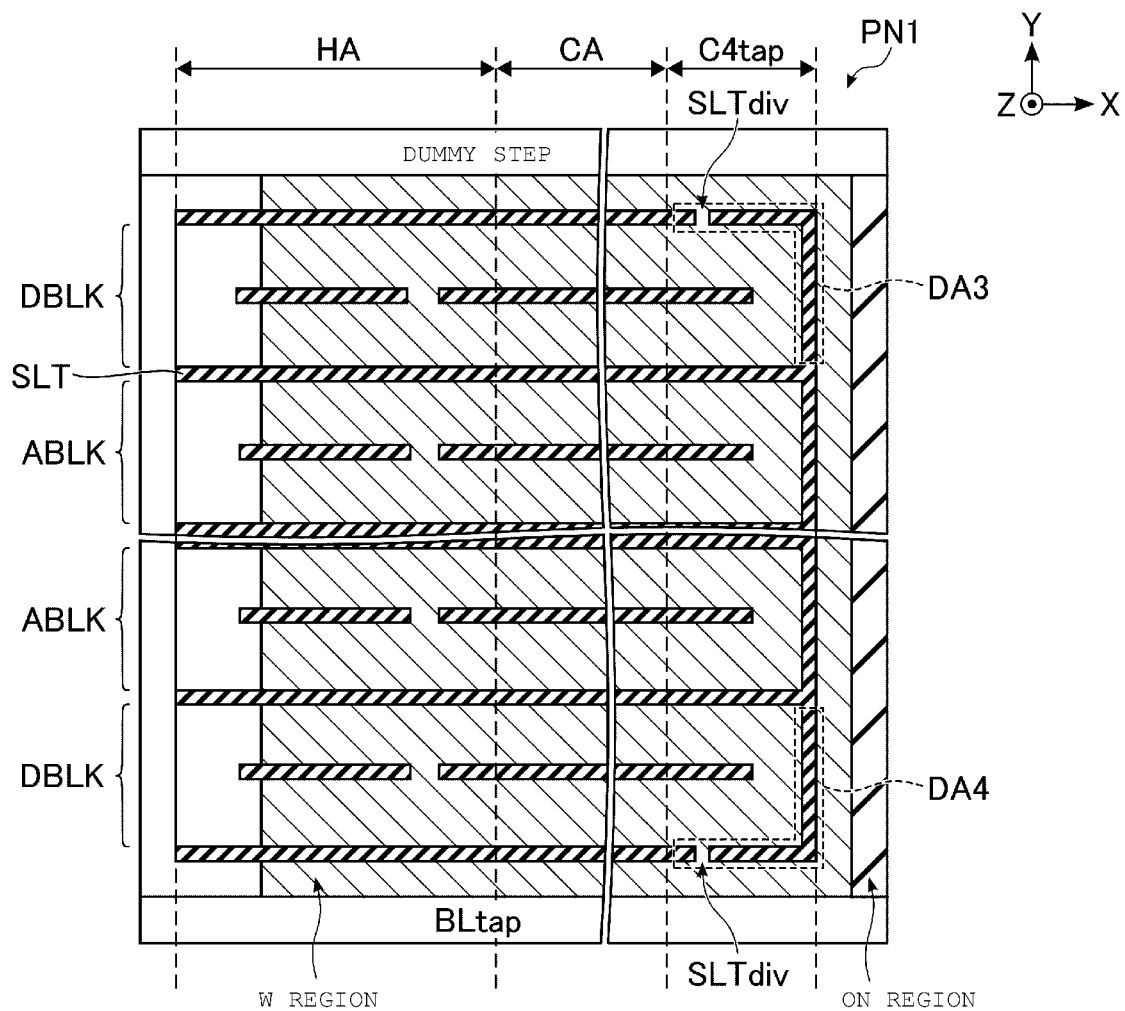
FIG. 20 illustrates a plan view of the memory cell array to illustrate an example of a region in which a slit gap can be provided in a semiconductor memory according to a modification example of the first embodiment.

FIG. 20 illustrates a specific example of a region in which the slit gap SLTdiv is provided with respect to a planar layout of the memory cell array 10 in a modification example of the first embodiment.

As illustrated in FIG. 20, in the modification example of the first embodiment, at least two slit gaps SLTdiv are provided in the block group BLKG.

Specifically, the slit gaps SLTdiv are respectively provided in the slit SLT in a region DA3 in contact with the dummy block DBLK on one side in the Y direction and the slit SLT in a region DA4 in contact with the dummy block DBLK on the other side in the Y direction. The regions DA3 and DA4 are disposed in the C4 connection region C4tap.

In the modification example of the first embodiment, the slit gap SLTdiv is not provided in the cell region CA. The rest of the structure of the memory cell array 10 in the modification example of the first embodiment is the same as, for example, that of the memory cell array 10 described in the first embodiment.

Figure 21:
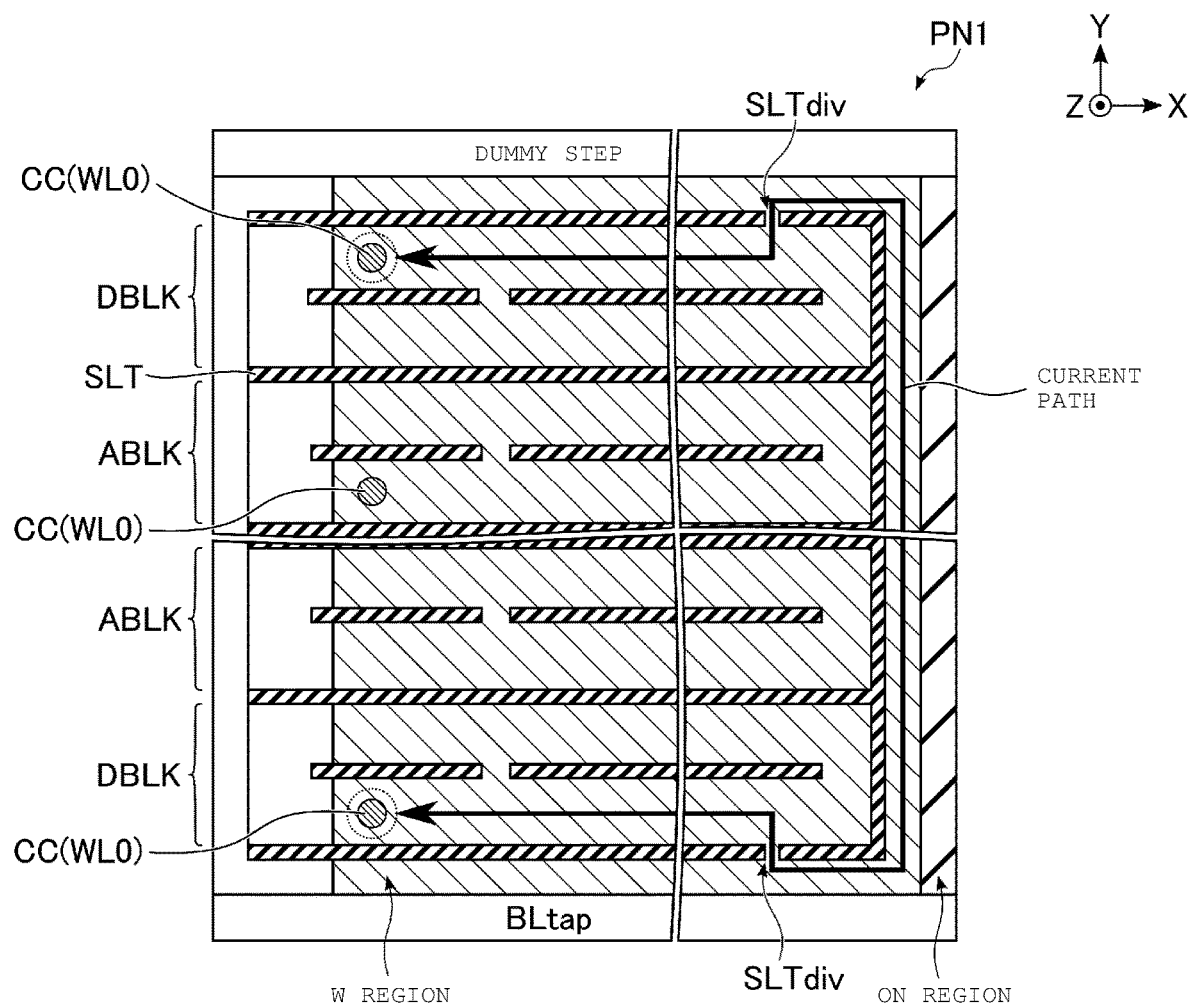
FIG. 21 is a diagram to explain an example of a method of measuring a resistance value of a word line by using two dummy blocks in the same block group in the semiconductor memory according to the modification example of the first embodiment.

FIG. 21 illustrates an example of a method of measuring the resistance value of the word line WL in the semiconductor memory 1 according to the modification example of the first embodiment. FIG. 21 illustrates the contacts CC corresponding to the word line WL0 of the dummy blocks DBLK provided on the Y-direction ends of the block group BLKG.

As illustrated in FIG. 21, in the semiconductor memory 1 according to the modification example of the first embodiment, a current path is formed between the contact CC in the dummy block DBLK on one side in the Y direction and the contact CC in the dummy block DBLK on the other side in the Y direction.

The current path passes through the word line WL provided in the cell region CA in both the dummy block DBLK on one side and the dummy block DBLK on the other side in the Y direction. In other words, the resistance value of the conductor 23 corresponding to the current path is, for example, the value obtained by adding a value which is twice the resistance value of the word line WL in the dummy block DBLK to the resistance value of the conductor 23 in the peripheral region.

Therefore, in the semiconductor memory 1 according to the modification example of the first embodiment, the wiring resistance between two dummy blocks DBLK is measured via the slit gaps SLTdiv, and thus the resistance value of the word line WL in the active block ABLK can be estimated. In other words, in the semiconductor memory 1 according to the modification example of the first embodiment, the resistance value of the word line WL in the active block ABLK can be estimated without a significant design change, and thus it is possible to reduce development cost for the semiconductor memory 1.

In the semiconductor memory 1 according to the modification example of the first embodiment, a short circuit occurring in the slit SLT can be detected as described in the first embodiment.

2. Second Embodiment

In a semiconductor memory 1 according to a second embodiment, the dummy block DBLK in the plane PN1 and the dummy block DBLK in the plane PN2 described in the first embodiment are integrally formed. In the following, with respect to the semiconductor memory 1 according to the second embodiment, differences from the first embodiment will be described.

2-1. Structure of Semiconductor Memory 1

Figure 22:
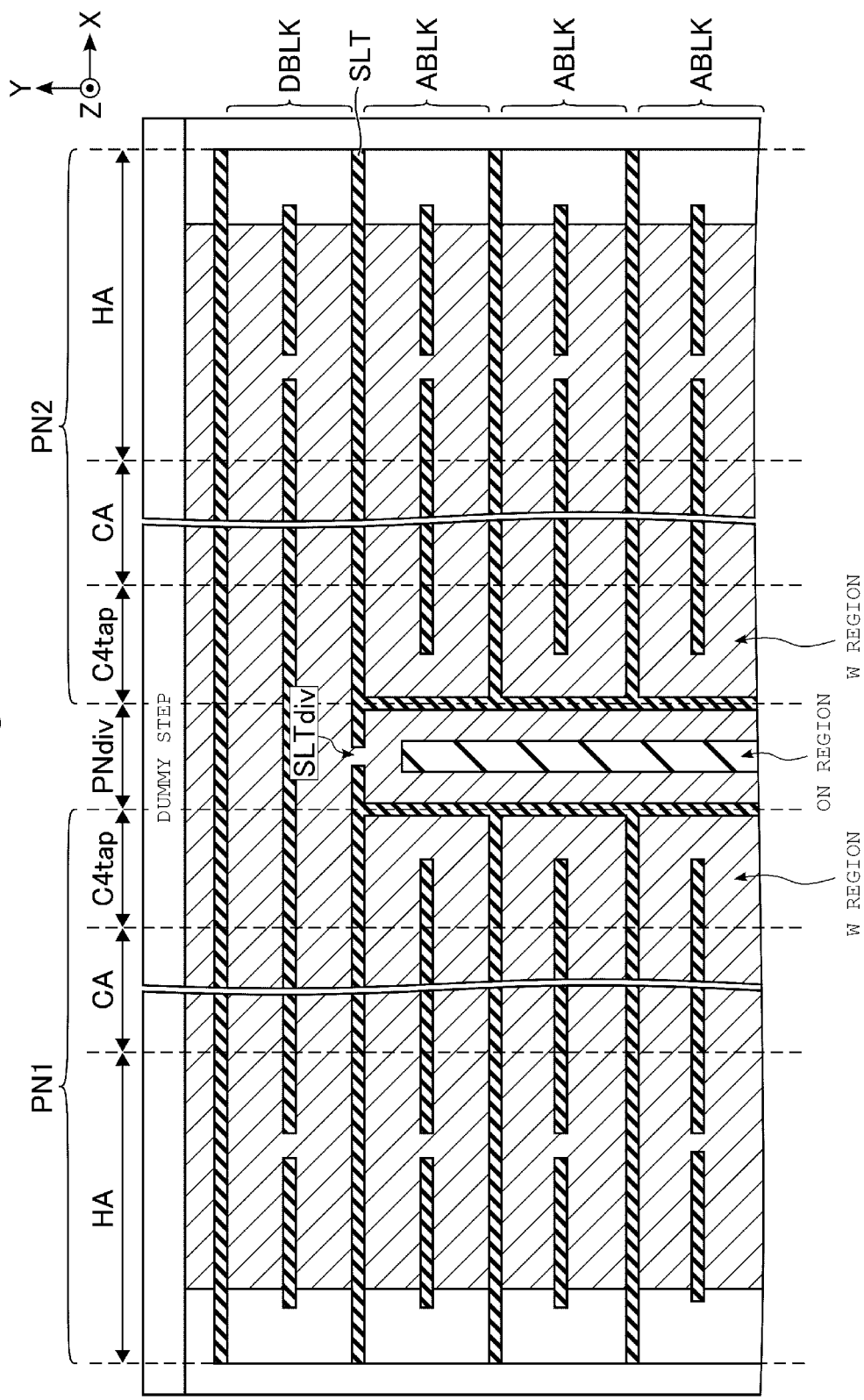
FIG. 22 illustrates a plan view of an example of a memory cell array of a semiconductor memory according to a second embodiment.

FIG. 22 illustrates an example of a planar layout of the memory cell array 10 of the semiconductor memory 1 according to the second embodiment by extracting a part of two block groups BLKG of planes PN1 and PN2 that are adjacent to each other.

As illustrated in FIG. 22, in the memory cell array 10 of the second embodiment, the dummy block DBLK in the plane PN1 and the dummy block DBLK in the plane PN2 are integrally formed.

Specifically, in the semiconductor memory 1 according to the second embodiment, the vertical-direction slits SLT in contact with the plane separation region PNdiv according to the first embodiment are omitted in the dummy blocks DBLK in the planes PN1 and PN2 of the semiconductor memory 1, and thus the horizontal-direction slits SLT adjacent to each other in the X direction are joined, for example.

Thus, the ON region is not provided between the two dummy blocks DBLK adjacent to each other in the X direction, and the W region is joined. In other words, the conductors 23 provided in the same layer in the dummy blocks DBLK adjacent to each other in the planes PN1 and PN2 are joined. In other words, the word lines WL provided in the same layer in the dummy blocks DBLK adjacent to each other in the planes PN1 and PN2 are electrically connected to each other.

In the semiconductor memory 1 according to the second embodiment, the slit gap SLTdiv is provided in the horizontal-direction slit SLT on the active block ABLK side in the plane separation region PNdiv in the integrally formed dummy block DBLK.

The W region is formed near the slit gap SLTdiv. The W region is joined with the W region which is provided near the vertical-direction slit SLT in contact with the active block ABLK in the plane separation region PNdiv.

In other words, the word line WL provided in the W region near the vertical-direction slit SLT is electrically connected to the word line WL provided in the same layer in the dummy block DBLK via the slit gap SLTdiv.

In the above description, a description has been made of the configuration of the dummy block DBLK on one side of a certain block group BLKG in the Y direction, and of the dummy block DBLK on the other side that has a configuration obtained by inverting, for example, the above-described configuration of the dummy block DBLK about the X direction symmetry axis.

The rest of the configuration of the semiconductor memory 1 according to the second embodiment described above is the same as, for example, the configuration of the semiconductor memory 1 according to the first embodiment, and thus a description thereof will be omitted.

The dummy block DBLK on the other side need not be in contact with the slit gap SLTdiv. The dummy block DBLK on the other side may have a structure which is separated between the planes PN1 and PN2 in the same manner as in the first embodiment.

2-2. Effect of Second Embodiment

According to the semiconductor memory 1 of the second embodiment described above, it is possible to detect a short circuit failure in the word line WL in the same manner as in the first embodiment.

Figure 23:
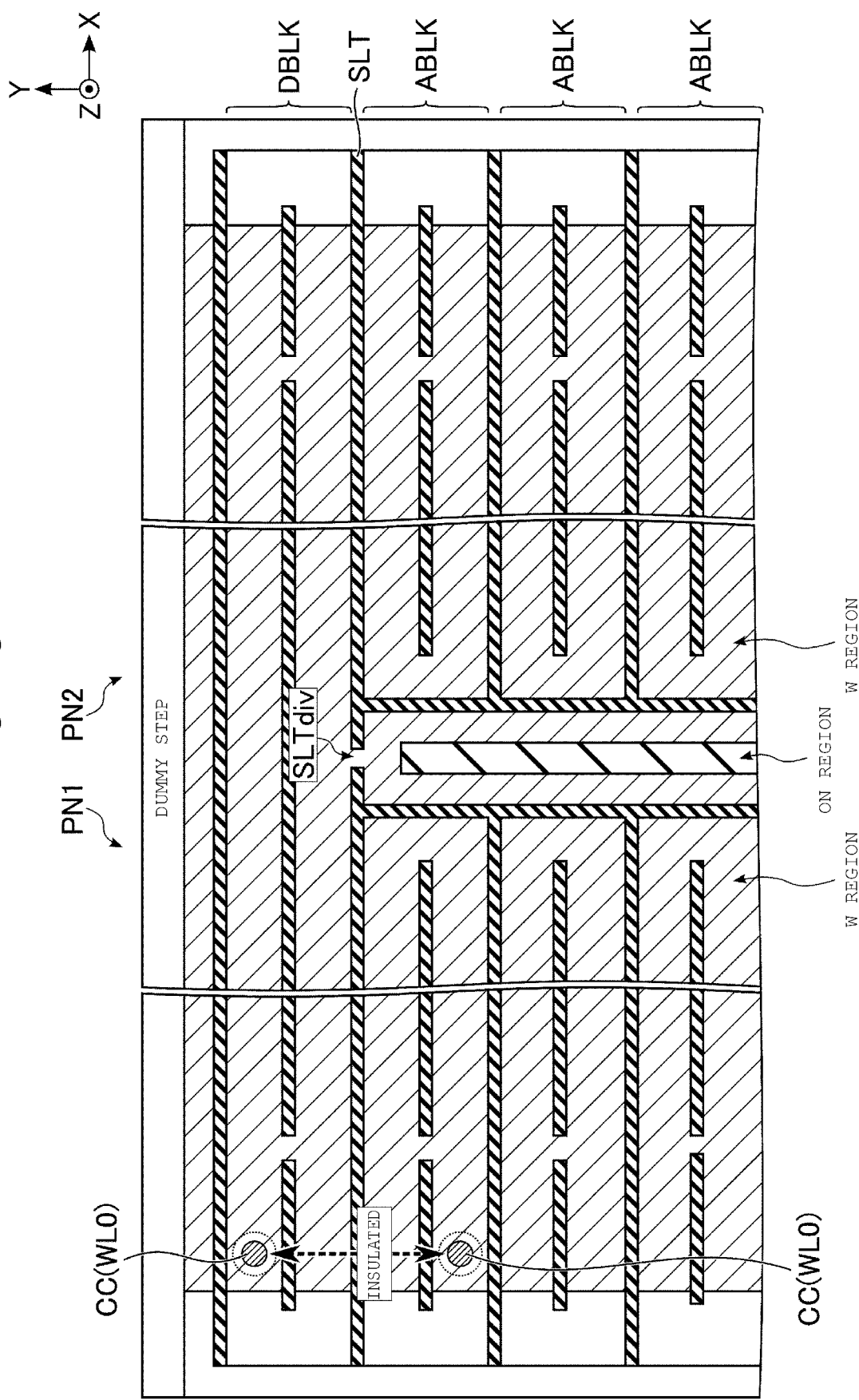
FIG. 23 is a diagram to explain a relationship between contacts respectively provided in an active block and a dummy block when a short circuit does not occur in a slit portion in the semiconductor memory according to the second embodiment.
Figure 24:
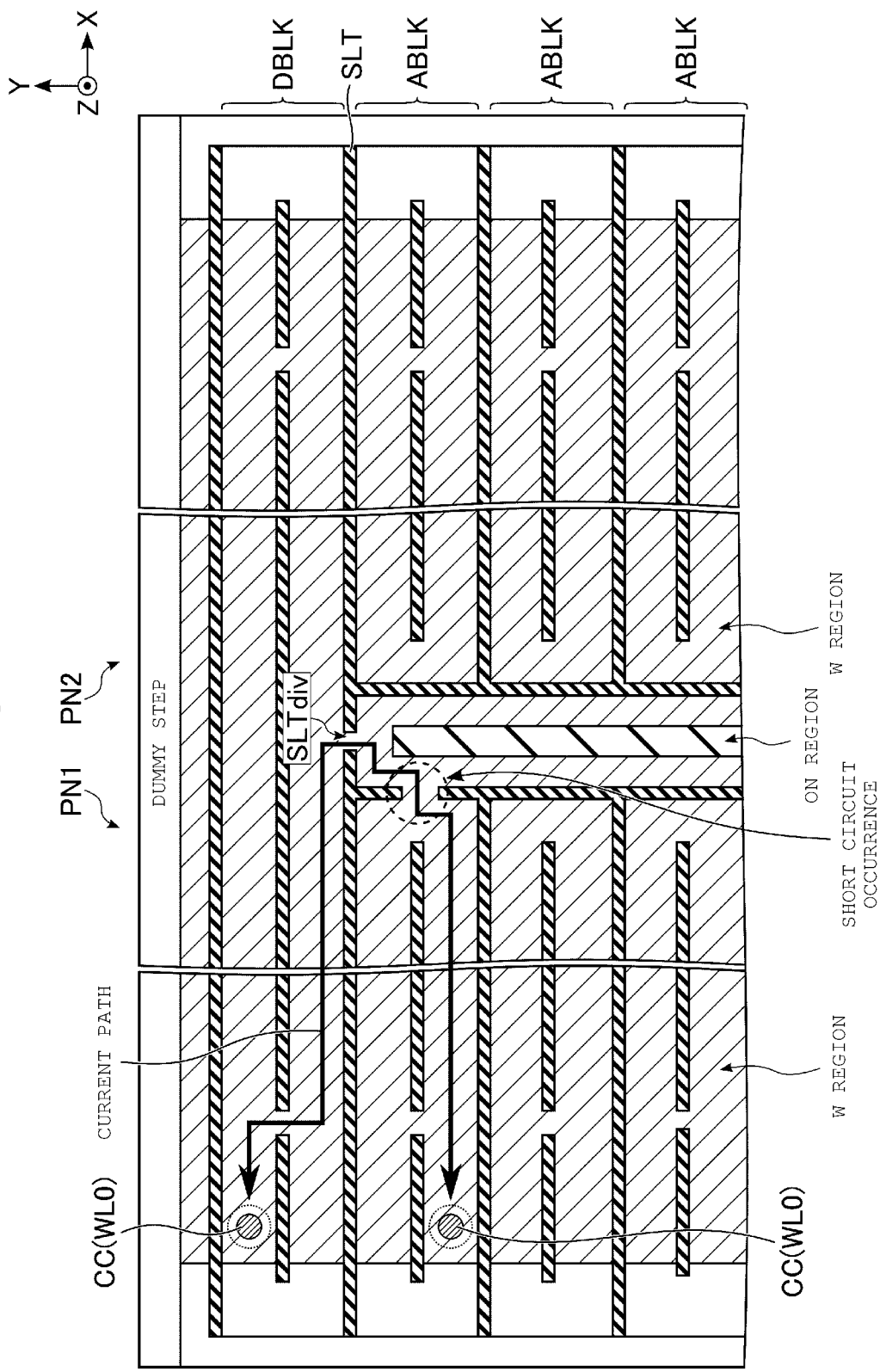
FIG. 24 is a diagram to explain a relationship between contacts respectively provided in the active block and the dummy block when a short circuit occurs in the slit portion in the semiconductor memory according to the second embodiment.

FIGS. 23 and 24 illustrate positions of the W region of the conductor 23 corresponding to the word line WL0 and of the slit SLT separating the conductor 23 in a planar layout of a single block group BLKG in both the planes PN1 and PN2 according to the second embodiment.

FIGS. 23 and 24 illustrate the contact CC corresponding to the word line WL0 of the dummy block DBLK in contact with the slit gap SLTdiv and the contact CC corresponding to the word line WL0 of the active block ABLK adjacent to the dummy block DBLK.

As illustrated in FIG. 23, when a short circuit failure does not occur in the slit SLT in contact with the peripheral region of the block group BLKG, the contact CC connected to the word line WL0 of the dummy block DBLK is insulated from the contact CC connected to the word line WL0 of the active block ABLK near the dummy block DBLK.

On the other hand, as illustrated in FIG. 24, when a short circuit failure occurs in the slit SLT in contact with both the peripheral region of the block group BLKG and the active block ABLK near the dummy block DBLK, the illustrated current path is formed. In other words, the contact CC connected to the word line WL0 of the active block ABLK is short-circuited to the contact CC connected to the word line WL0 of the dummy block DBLK via the slit gap SLTdiv, the W region provided in the peripheral region, and the short circuit occurrence location of the vertical-direction slit SLT.

As described above, in the semiconductor memory 1 according to the second embodiment, in the same manner as in the first embodiment, the state between the contact CC connected to a wiring in the dummy block DBLK and the contact CC connected to a wiring in the active block ABLK is examined, and thus it is possible to detect whether or not a short circuit failure occurs between the active block ABLK and a peripheral region thereof.

As a result, in the semiconductor memory 1 according to the second embodiment, in the same manner as in the first embodiment, a short circuit failure caused by the slit SLT can be detected, and thus it is possible to minimize the occurrence of acquired defects or performance variation in the semiconductor memory 1.

In the semiconductor memory 1 according to the second embodiment, it is possible to estimate a resistance value of the word line WL of the active block ABLK as in the semiconductor memory 1 according to the modification example of the first embodiment by using the dummy block DBLK.

Figure 25:
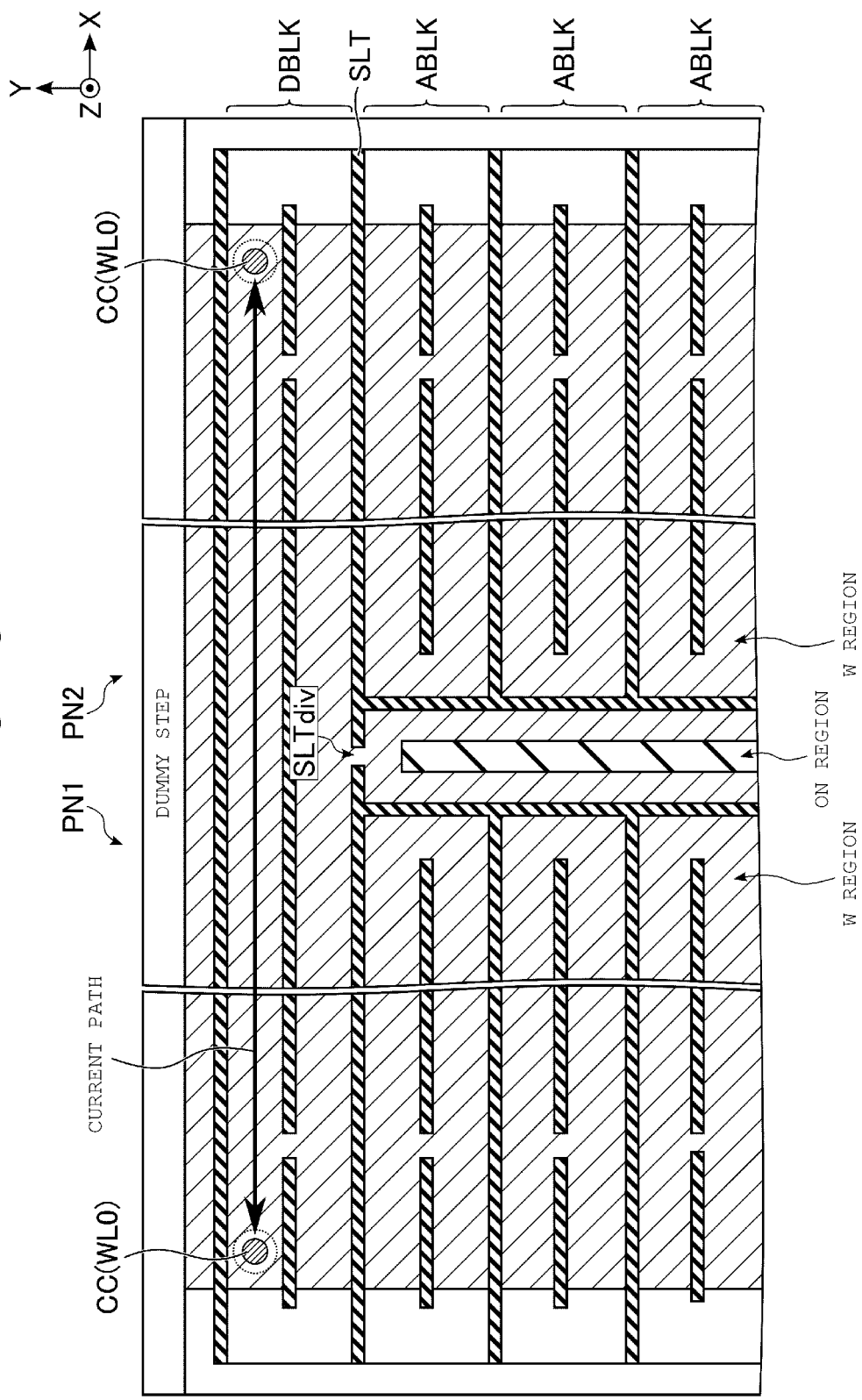
FIG. 25 is a diagram to explain an example of a method of measuring a resistance value of a word line by using two dummy blocks adjacent to each other between planes in the semiconductor memory according to second embodiment.

FIG. 25 illustrates an example of a method of measuring a resistance value of the word line WL in the semiconductor memory 1 according to the second embodiment. FIG. 25 illustrates the contacts CC corresponding to the word line WL0 in the two dummy blocks DBLK adjacent to each other in the planes PN1 and PN2.

As illustrated in FIG. 25, in the semiconductor memory 1 according to the second embodiment, a current path is formed between the contact CC in the dummy block DBLK of the plane PN1 and the contact CC in the dummy block DBLK of the plane PN2.

The current path passes through the word line WL provided in the cell region CA in the dummy blocks DBLK adjacent to each other in the X direction. In other words, the resistance value of the conductor 23 corresponding to the current path is, for example, the value obtained by adding a value which is twice the resistance value of the word line WL in the dummy block DBLK to a resistance value of the conductor 23 in the plane separation region PNdiv.

Therefore, in the semiconductor memory 1 according to the second embodiment, the wiring resistance between two dummy blocks DBLK is measured, and thus a resistance value of the word line WL in the active block ABLK can be estimated.

3. Another Modification Example and the Like

The semiconductor memory of the embodiments includes first to fourth regions (for example, HA, CA, C4tap, and PNdiv), an active region (for example, ABLK), a first dummy region (for example, DBLK), first to third stacked bodies, a fourth insulator (for example, SLT), first and second contacts (for example, CC), and first and second pillars (for example, MP). The first to fourth regions are arranged on one side in a first direction. The active region includes a part of each of the first to third regions. The first dummy region includes a part of each of the first to third regions. The first stacked body includes a first insulator and a first conductor (for example, 23 in FIG. 7) which are provided over the first region to the third region and are alternately stacked in the active region. The second stacked body includes a second insulator and a second conductor (for example, 23 in FIG. 9) which are provided over the first region to the third region and are alternately stacked in the first dummy region. The third stacked body includes a third insulator and a third conductor (for example, 23 in FIG. 14) alternately stacked in the fourth region. The fourth insulator (for example, SLT in FIG. 14) is provided between the first stacked body and the third stacked body. The first contact is provided in a columnar shape on a first conductor in a first layer among the stacked first conductors in the first region. The second contact is provided in a columnar shape on a second conductor in the first layer among the stacked second conductors in the first region. Each of a plurality of first pillars penetrates through the stacked first conductors in the second region, and a portion thereof intersecting the first conductor functions as a memory cell. Each of a plurality of second pillars penetrates through the stacked second conductors in the second region. Among the stacked third conductors, a third conductor adjacent to the first conductor in the first layer in the first direction is electrically connected to the second conductor in the first layer. Consequently, in the semiconductor memory according to the embodiment, it is possible to detect a short circuit failure in a word line.

In the structure of the memory cell array 10 described in the embodiments, the memory pillar MP may have a structure in which a plurality of pillars are connected to each other in the Z direction. For example, the memory pillar MP may have a structure in which a plurality of pillars each penetrating through a plurality of conductors 23 are connected to each other in the Z direction. The memory pillar MP may have a structure in which a pillar penetrating through the conductors 22 and 23 and a pillar penetrating through the conductor 24 are connected to each other. In this case, the slit SLT does not separate, for example, the conductor 24, and the conductor 24 is separated by a slit which is different from the slit SLT.

In the embodiments, a description has been made of an example where the word lines WL form steps of two rows in the lead region HA, but the structure is not limited to this. For example, in the lead region HA, end parts of the word lines WL may be formed in a step of one row, and may be formed in steps of three or more rows.

Figure 26:
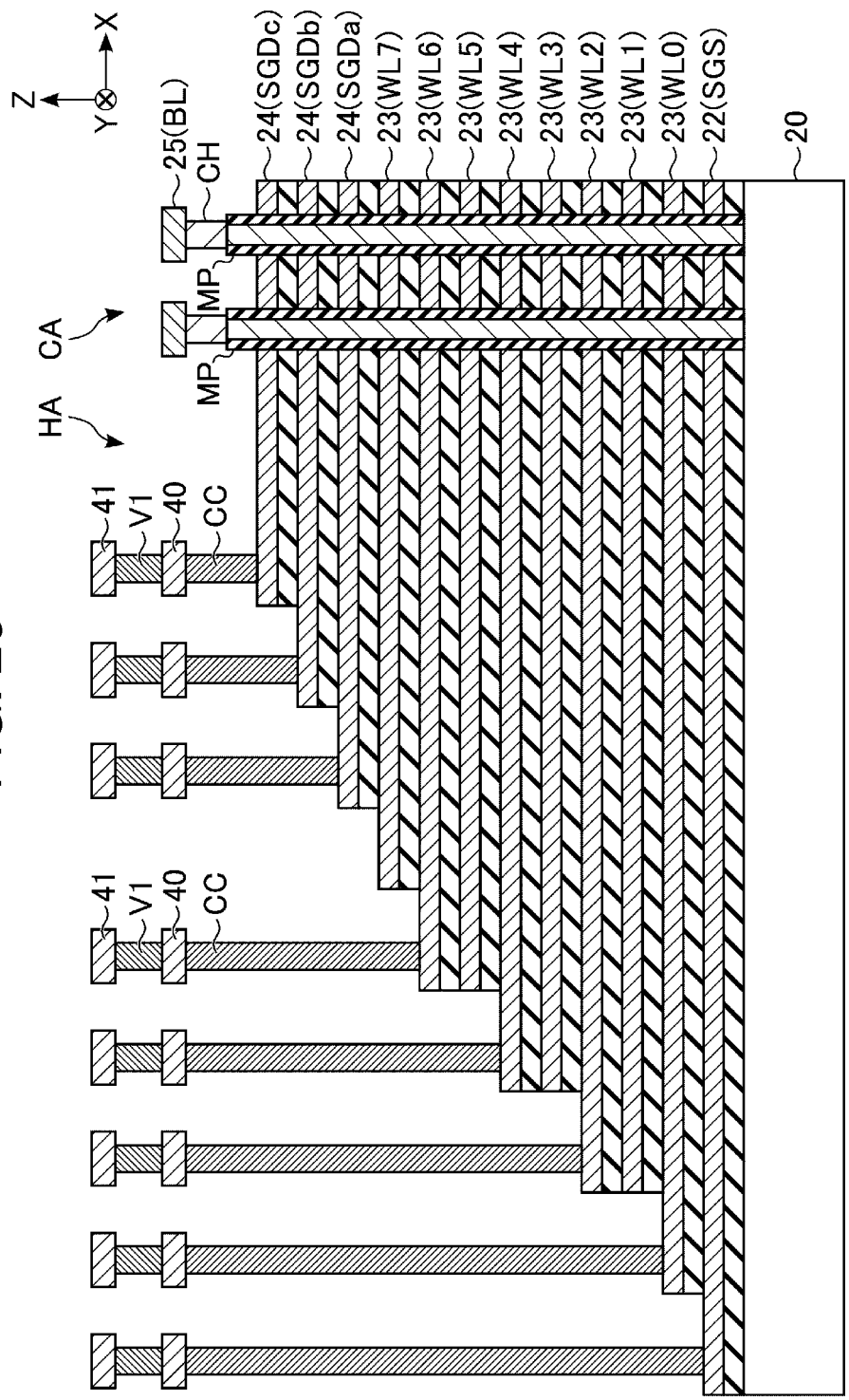
FIG. 26 illustrates a cross-sectional view of an example of a memory cell array in a modification example of the first embodiment.

In the embodiments, a description has been made of an example where circuits such as the row decoder module 15 are formed under the memory cell array 10, but the structure is not limited to this. FIG. 26 illustrates an example of a cross-sectional structure of the memory cell array 10 in a modification example of the first embodiment.

As illustrated in FIG. 26, the memory cell array 10 may be formed on the semiconductor substrate 20. Specifically, the conductor 22 is stacked on the semiconductor substrate 20 via an insulating layer. An insulating layer and the conductor 23 are alternately stacked on the conductor 22. An insulating layer and the conductor 24 are alternately stacked on the uppermost conductor 23. In the cell region CA, the memory pillar MP penetrates through the conductors 22 to 24, and a bottom part of the memory pillar MP is connected to a well region (not illustrated) on the semiconductor substrate 20. The source line SL (not illustrated) is electrically connected to the well region.

In the present modification example, a stepped structure of each wiring formed in the lead region HA is the same as the structure in the memory cell array 10 described in the first embodiment. A wiring laid out from each end part of the conductors 22 to 24 is electrically connected to the row decoder module 15 on the semiconductor substrate 20 in a region that is not illustrated. The rest of the structure of the semiconductor memory 1 in the present modification example is the same as, for example, the structure of the semiconductor memory 1 according to the first embodiment. Such a structure may be applied to the semiconductor memory 1 according to the second embodiment.

In the embodiments, a description has been made of an example where the region of the memory cell array 10 includes a single C4 connection region C4tap, but a plurality of C4 connection regions C4tap may be provided in the cell region CA. The number of C4 connection regions C4tap inserted into the cell region CA may be designed to be any number.

In the embodiments, a description has been made of an example in which the contacts CS and C4 are provided in the C4 connection region C4tap adjacent to the plane separation region PNdiv, but the contacts CS and C4 need not be provided in the C4 connection region C4tap adjacent to the plane separation region PNdiv. It is sufficient that at least a terrace portion of each select gate line SGD is formed in the C4 connection region C4tap adjacent to the plane separation region PNdiv.

In the embodiments, whether the block BLK provided in the memory cell array 10 is the dummy block DBLK or the active block ABLK may be determined based on whether or not a block address BAd is allocated thereto.

Specifically, the block address BAd is not allocated to the dummy block DBLK, and the block address BAd is allocated to the active block ABLK. For example, when blocks are accessed in order while increasing the block address BAd by one, the block BLK which is not accessed at all may be determined as being the dummy block DBLK.

A structure of the memory cell array 10 may be other structures. Other configurations of the memory cell array 10 are disclosed in, for example, U.S. patent application Ser. No. 12/407,403, filed on Mar. 19, 2009, entitled "three-dimensional stacked nonvolatile semiconductor memory". Other configurations of the memory cell array 10 are also disclosed in U.S. patent application Ser. No. 12/406,524, filed on Mar. 18, 2009, entitled "three-dimensional stacked nonvolatile semiconductor memory", and U.S. patent application Ser. No. 12/679,991, filed on Mar. 25, 2010, entitled "nonvolatile semiconductor storage device and manufacturing the same".

Other configurations of the memory cell array 10 are also disclosed in U.S. patent application Ser. No. 14/532,030, filed on Mar. 23, 2009, entitled "semiconductor memory and manufacturing same". The overall contents of the patent applications are incorporated by reference in the present application.

The term "connection" in the present specification indicates that elements are electrically connected to each other, and includes that the elements are electrically connected to each other via other elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a substrate including first, second, third, fourth, fifth, sixth, and seventh regions, the first, second, third, and fourth regions provided in this order along a first direction parallel to a surface of the substrate, the fifth, sixth, and seventh regions provided in this order along the first direction adjacent to the first region, the second region, and the third region, respectively, in a second direction parallel to a surface of the substrate, the second direction being different from the first direction, the forth region provided adjacent also to the seventh region in the first direction;
a first stacked body including an alternating stack of first insulators and first conductors above the substrate in the first, second, and third regions;
a second stacked body including an alternating stack of second insulators and second conductors above the substrate in the fifth, sixth, and seventh regions;
a third stacked body including an alternating stack of third insulators and third conductors above the substrate in the fourth region;
a fourth insulator separating the first stacked body and the third stacked body;
a columnar first contact provided on one of the first conductors closest to the substrate in the first region;
a columnar second contact provided on one of the second conductors closest to the substrate in the fifth region;
a plurality of first pillars, each of the first pillars extending through the first stacked body in the second region, and having memory cell regions at intersections with the first conductors; and
a plurality of second pillars, each of the second pillars extending through the second stacked body in the sixth region,
wherein one of the third conductors closest to the substrate is electrically insulated from said one of the first conductors closest to the substrate, and electrically connected to said one of the second conductors closest to the substrate.

2. The semiconductor memory according to claim 1, wherein
a peripheral region is provided in the substrate in adjacent to the the fifth, sixth, and seventh regions in the second direction,
the semiconductor memory further comprises:
a fourth stacked body including an alternating stack of fifth insulators and fourth conductors; and
a sixth insulator separating the second stacked body and the fourth stacked body,
wherein one of the fourth conductors closest to the substrate is electrically connected to said one of the second conductors closest to the substrate.

3. The semiconductor memory according to claim 2, wherein
said one of the fourth conductors closest to the substrate is integrally provided with said one of the second conductors closest to the substrate.

4. The semiconductor memory according to claim 3, wherein
the sixth insulator includes a gap through which said one of the fourth conductors closest to the substrate is electrically connected to said one of the second conductors closest to the substrate.

5. The semiconductor memory according to claim 1, wherein
the fourth insulator includes a gap through which said one of the third conductors closest to the substrate is electrically connected to said one of the second conductors closest to the substrate.

6. The semiconductor memory according to claim 1, wherein
a columnar contact is connected to each of the first conductors in the first region, and
no columnar contact is connected to any of the first conductors in the third region.

7. The semiconductor memory according to claim 1, wherein
the substrate further includes eighth, ninth, and tenth regions provided in this order along the first direction adjacent to the first, second, and third regions, respectively, in the second direction,
the semiconductor memory further comprises:
a fifth stacked body including an alternating stack of seventh insulators and fifth conductors above the substrate in the eighth, ninth, and tenth regions; and
a plurality of third pillars, each of the third pillars extending through the fifth stacked body, and
one of the third conductors closest to the substrate is adjacent to one of the seventh conductors closest to the substrate via the fourth insulator.

8. The semiconductor memory according to claim 1, wherein
the substrate further includes eleventh, twelfth, thirteenth, fourteenth, fifteenth, and sixteenth regions, the eleventh, twelfth, and thirteenth regions provided in this order along first the direction, the eleventh region being adjacent to the fourth region, the fourteenth, fifteenth, and sixteenth regions provided in this order along the first direction adjacent to the eleventh region, the twelfth region, and the thirteenth region, respectively, in the second direction, the fourteenth region being adjacent to the fourth region,
the semiconductor memory further comprises:
a sixth stacked body including an alternating stack of eighth insulators and sixth conductors above the substrate in the eleventh, twelfth, and thirteenth regions;
a seventh stacked body including an alternating stack of ninth insulators and seventh conductors above the substrate in the fourteenth, fifteenth, and sixteenth regions;
a columnar fourth contact provided on one of the sixth conductors closest to the substrate;
a columnar fifth contact provided on one of the seventh conductors closest to the substrate;
a plurality of third pillars, each of the third pillars extending through the sixth stacked body, and having memory cell regions at intersections with the sixth conductors; and
a plurality of fourth pillars, each of the fourth pillars extending through the seventh stacked body, and
one of the third conductors closest to the substrate is electrically insulated from said one of the sixth conductors closest to the substrate, and electrically connected to said one of the seventh conductors closest to the substrate.

9. The semiconductor memory according to claim 1, wherein each of the first conductors serves as a word line.

10. The semiconductor memory according to claim 1, wherein each of the third conductors is electrically insulated from one of the first conductors in a same layer level, and electrically connected to one of the second conductors in the same layer level.

11. A semiconductor memory comprising:
a substrate, wherein:
an active lead region, an active memory cell region, and an active connection region are provided in this order along a first direction parallel to a surface of the substrate,
a dummy lead region, a dummy cell region, and a dummy connection region are provided in this order along the first direction adjacent to the active lead region, the active memory cell region, and the active connection region, respectively, in a second direction parallel to a surface of the substrate, the second direction being different from the first direction, and
a separation region is provided adjacent to the active connection region and the dummy connection region in the first direction;
a plurality of word line layers above the substrate in the active lead region, the active memory cell region, and the active connection region;
a plurality of dummy word line layers above the substrate in the dummy lead region, the dummy cell region, and the dummy connection region;
a plurality of conductive layers above the substrate in the separation region, the conductive layers being provided at same layer levels as the word line layers and the dummy word line layers, respectively;
a first contact extending through one or more of the word line layers and in contact with one of the word line layers in the active lead region;
a second contact extending through one or more of the dummy word line layers and in contact with one of the dummy word line layers in the dummy lead region;
a plurality of first pillars in the active memory cell region, each of the first pillars extending through the word line layers; and
a plurality of second pillars in the dummy cell region, each of the second pillars extending through the dummy word line layers,
wherein one of the conductive layers in the separation region in a layer level is electrically insulated from one of the word line layers in the layer level, and electrically connected to one of the dummy word line layers in the layer level.

12. The semiconductor memory according to claim 11, wherein
a peripheral region is provided adjacent to the dummy lead region, the dummy cell region, and the dummy connection region on a side opposite to a side adjacent to the active memory cell region, and the active connection region, respectively,
the semiconductor memory further comprises a plurality of second conductive layers above the substrate in the peripheral region, the second conductive layers being provided at same layer levels as the word line layers, the dummy word line layers, and the conductive layers, respectively, and
said one of the conductive layers in the layer level is electrically connected to said one of the dummy word line layers in the layer level via one of the second conductive layers in the layer level.

13. The semiconductor memory according to claim 12, wherein said one of the conductive layers in the layer level is integrally provided with said one of the second conductive layers.

14. The semiconductor memory according to claim 13, further comprising:
an insulating wall extending in a thickness direction between the peripheral region and each of the dummy cell region and the dummy connection region, the insulating wall includes a gap through which said one of the dummy word line layers in the layer level is electrically connected to said one of the second conductive layers in the layer level.

15. The semiconductor memory according to claim 11, wherein
no contact is provided on any of the word line layers in the active connection region, and
no contact is provided on any of the dummy word line layers in the dummy connection region.

16. The semiconductor memory according to claim 11, wherein
a second dummy lead region, a second dummy cell region, and a second dummy connection region are provided in this order along the first direction,
the semiconductor memory further comprises a plurality of second dummy word line layers above the substrate in the second dummy lead region, the second dummy cell region, and the second dummy connection region, and
one of the conductive layers in the separation region in the layer level is electrically connected to one of the second dummy word line layers in the layer level.

17. The semiconductor memory according to claim 11, wherein
a second active connection region, a second active memory cell region, and a second active lead region are provided in this order along the first direction,
a second dummy connection region, a second dummy cell region, and a dummy lead region are provided in this order along the first direction adjacent to the second active connection region, the second active memory cell region, and the second active lead region, respectively, in the second direction of the substrate,
the separation region is provided adjacent to the second active connection region and the second dummy connection region in the first direction.

18. The semiconductor memory according to claim 17, further comprises:
a plurality of second word line layers above the substrate in the second active lead region, the second active memory cell region, and the second active connection region;
a plurality of second dummy word line layers above the substrate in the second dummy lead region, the second dummy cell region, and the second dummy connection region;
a third contact extending through one or more of the second word line layers and in contact with one of the second word line layers in the second active lead region;
a fourth contact extending through one or more of the second dummy word line layers and in contact with one of the second dummy word line layers in the second dummy lead region;
a plurality of third pillars in the second active memory cell region, each of the third pillars extending through the second word line layers; and a plurality of fourth pillars in the second dummy cell region, each of the fourth pillars extending through the second dummy word line layers.

19. The semiconductor memory according to claim 18, wherein
said one of the conductive layers in the separation region in the layer level is electrically insulated from one of the second word line layers in the layer level, and electrically connected to one of the second dummy word line layers in the layer level.

20. The semiconductor memory according to claim 11, wherein each of the conductive layers in the separation region is electrically insulated from one of the word line layers in a same layer level, and electrically connected to one of the dummy word line layers in the same layer level.

* * * * *